US011356626B2

(12) United States Patent
Wang et al.

(10) Patent No.: US 11,356,626 B2
(45) Date of Patent: Jun. 7, 2022

(54) FLEXIBLE EXPOSURE CONTROL FOR IMAGE SENSORS WITH PHASE DETECTION AUTO FOCUS PIXELS

(71) Applicant: OMNIVISION TECHNOLOGIES, INC., Santa Clara, CA (US)

(72) Inventors: Rui Wang, San Jose, CA (US); Eiichi Funatsu, San Jose, CA (US); Woon Il Choi, Sunnyvale, CA (US); Keiji Mabuchi, Los Altos, CA (US); Chin Poh Pang, Pleasanton, CA (US); Qingfei Chen, Santa Clara, CA (US); Da Meng, Fremont, CA (US); Vivian Wang, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 222 days.

(21) Appl. No.: 16/855,850

(22) Filed: Apr. 22, 2020

(65) Prior Publication Data

US 2021/0337144 A1 Oct. 28, 2021

(51) Int. Cl.
*H04N 5/369* (2011.01)
*H01L 27/146* (2006.01)
(Continued)

(52) U.S. Cl.
CPC ... *H04N 5/36961* (2018.08); *H01L 27/14605* (2013.01); *H01L 27/14612* (2013.01);
(Continued)

(58) Field of Classification Search
CPC .. H04N 5/36961; H04N 5/3559; H04N 5/378; H01L 27/14605; H01L 27/14612;
(Continued)

(56) References Cited

U.S. PATENT DOCUMENTS 7,916,195 B2 3/2011 Kudoh
9,215,426 B2 12/2015 Kim et al.
(Continued)

FOREIGN PATENT DOCUMENTS

TW 201216207 A1 4/2012
TW 201225631 A1 6/2012

OTHER PUBLICATIONS

Search Report for ROC (Taiwan) Patent Application No. 110114258, dated Feb. 21, 2022 (2 pages, with translation).

*Primary Examiner* — Tony Ko
(74) *Attorney, Agent, or Firm* — Perkins Coie LLP

(57) ABSTRACT

An imaging device includes a photodiode array. The photodiodes include a first set of photodiodes configured as image sensing photodiodes and a second set of photodiodes configured as phase detection auto focus (PDAF) photodiodes. The PDAF photodiodes are arranged in at least pairs in neighboring columns and are interspersed among the image sensing photodiodes. Transfer transistors are coupled to corresponding photodiodes. The transfer transistors coupled to the image sensing photodiodes included in an active row of are controlled in response to a first transfer control signal or a second transfer control signal that control all of the image sensing photodiodes of the active row. A transfer transistor is coupled to one of a pair of the PDAF photodiodes of the active row. The first transfer transistor is controlled in response to a first PDAF control signal that is independent of the first or second transfer control signals.

52 Claims, 17 Drawing Sheets

(51) Int. Cl.
*H04N 5/355* (2011.01)
*H04N 5/378* (2011.01)

(52) U.S. Cl.
CPC .. *H01L 27/14621* (2013.01); *H01L 27/14641* (2013.01); *H01L 27/14645* (2013.01); *H04N 5/3559* (2013.01); *H04N 5/378* (2013.01)

(58) Field of Classification Search
CPC ......... H01L 27/14621; H01L 27/14641; H01L 27/14645
See application file for complete search history.

(56) References Cited

U.S. PATENT DOCUMENTS

| | | | |
|---|---|---|---|
| 2014/0062599 A1 | 3/2014 | Xu et al. | |
| 2015/0312461 A1* | 10/2015 | Kim | H01L 27/14621 348/308 |
| 2015/0312557 A1* | 10/2015 | Kim | H04N 13/271 348/46 |
| 2019/0098243 A1 | 3/2019 | Liu | |

* cited by examiner

FLEXIBLE EXPOSURE CONTROL FOR IMAGE SENSORS WITH PHASE DETECTION AUTO FOCUS PIXELS

BACKGROUND INFORMATION

Field of the Disclosure

This disclosure relates generally to image sensors, and in particular but not exclusively, relates to image sensors that include phase detection auto focus pixels.

Background

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output signal from each photosensitive element that varies as a function of the incident image light. In other words, the amount of image charge generated is proportional to the intensity of the image light, which is utilized to produce a digital image (i.e., image data) representing the external scene.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
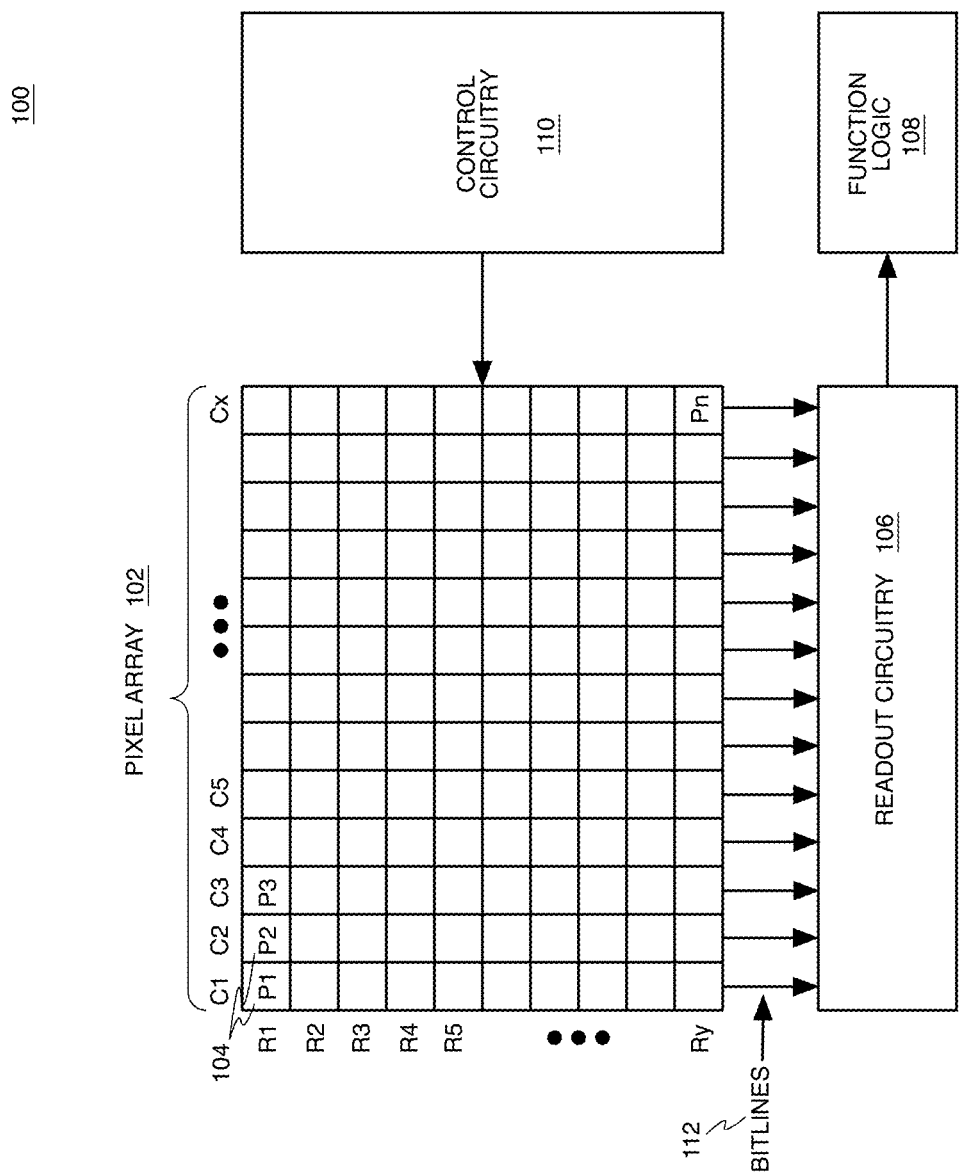
FIG. 1A illustrates one example of an imaging system including an image sensor with phase detection auto focus pixels in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Examples directed to flexible exposure control for color pixel arrays with arrays of photodiodes including phase detection autofocus photodiodes interspersed among binned image sensing photodiodes are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of color pixel arrays with arrays of photodiodes including phase detection autofocus photodiodes interspersed among binned image sensing photodiodes are disclosed. In the various examples, at least some of the transfer transistors coupled to the phase detection autofocus photodiodes may be controlled separately from the image sensing photodiodes in the same row of the array of photodiodes of an image sensor, which provides flexible exposure control, high speed, and low power consumption for the image sensor in accordance with the teachings of the present invention.

To illustrate, FIG. 1A illustrates one example of an imaging system 100 including a color pixel array 102 with an array of photodiodes including phase detection autofocus photodiodes interspersed among binned image sensing photodiodes in accordance with an embodiment of the present disclosure. In particular, imaging system 100 includes pixel array 102, control circuitry 108, readout circuitry 104, and function logic 106. In one example, pixel array 102 is a two-dimensional (2D) array of photodiodes, (e.g., P1, P2, Pn), which include phase detection autofocus photodiodes interspersed among binned image sensing photodiodes. As will described in further detail below, in various examples at least some of the transfer transistors coupled to the phase detection autofocus photodiodes may be controlled separately from the image sensing photodiodes in the same row of the array of photodiodes 104. As illustrated in the depicted example, pixels 104 are arranged into rows (e.g., R1 to Ry) and columns (e.g., C1 to Cx) to acquire image data of a person, place, object, etc., which can then be used to render a 2D image of the person, place, object, etc. In the examples, the phase detection autofocus photodiodes interspersed in the pixel array 102 provide phase detection information, which can be used for autofocus operations of imaging system 100.

In one example, after each image sensor photodiode/pixel 104 in pixel array 102 has acquired its image charge or phase detection charge through photogeneration of the charge, corresponding image data and/or phase detection charge is read out by a readout circuit through bit lines 112 and then transferred to function logic 106. Readout circuitry 104 may be coupled to read out data from the plurality of pixels 104 in pixel array 102. In various examples, the readout circuitry 104 may include amplification circuitry, analog-to-digital (ADC) conversion circuitry, or otherwise. In one example, the readout circuitry 104 may read out a row of data at a time along bit lines 112 as illustrated in FIG. 1A. The function logic 106 may store the image data or even manipulate the image data by applying post image effects (e.g., crop, rotate, remove red eye, adjust brightness, adjust contrast, or otherwise).

Figure 1B:
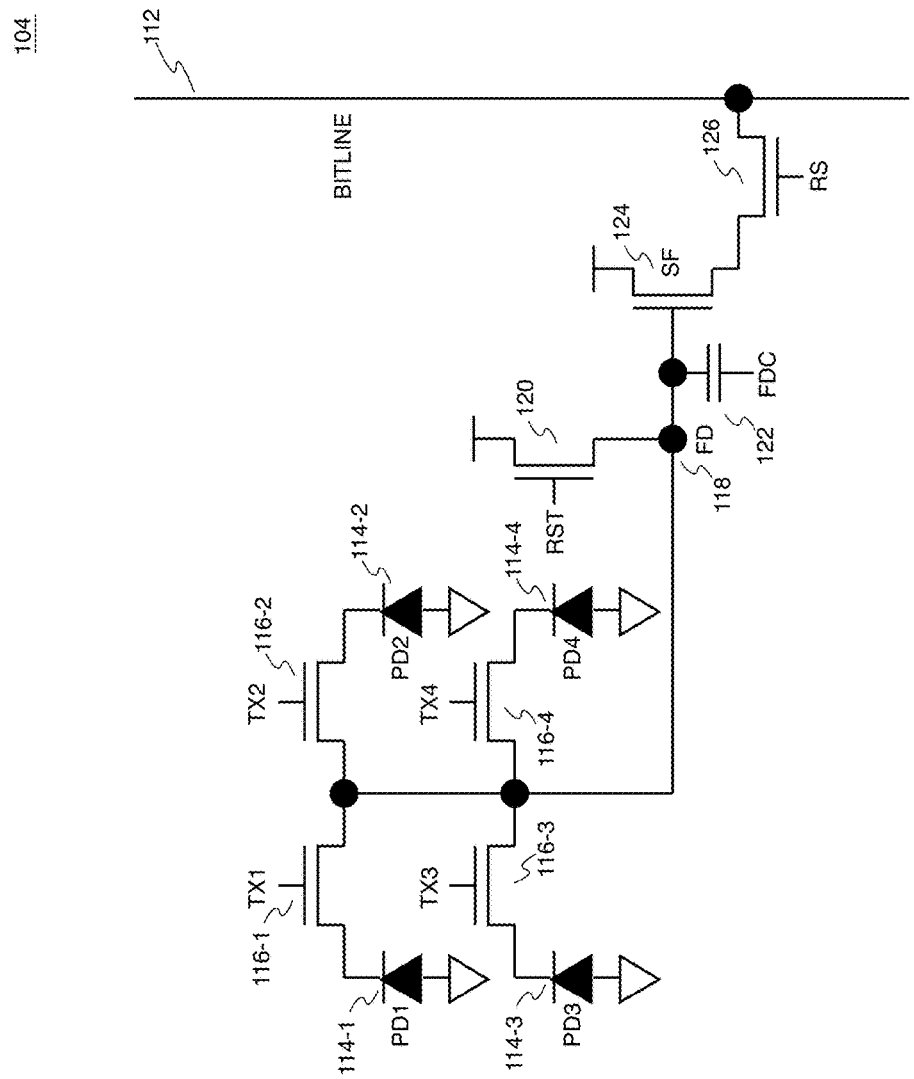
FIG. 1B illustrates one example of a pixel circuit included in an imaging system with an array of photodiodes including phase detection autofocus photodiodes interspersed among binned image sensing photodiodes in accordance with the teachings of the present invention in accordance with the teachings of the present invention.

FIG. 1B illustrates one example of a schematic of pixel circuit 104, which is included in an imaging system with an array of photodiodes including phase detection autofocus photodiodes interspersed among binned image sensing photodiodes in accordance with the teachings of the present invention. It is appreciated the pixel circuit 104 of FIG. 1B may be an example of a pixel 104 of the image sensor 100 as shown in FIG. 1A, and that similarly named and numbered elements described above are coupled and function similarly below.

In the example depicted in FIG. 1B, pixel circuit 104 includes a photodiode 114-1 coupled to a transfer transistor 116-1, a photodiode 114-2 coupled to a transfer transistor 116-2, a photodiode 114-3 coupled to a transfer transistor 116-3, and a photodiode 114-4 coupled to a transfer transistor 116-4. A floating diffusion 118 is coupled to transfer transistor 116-1, transfer transistor 116-2, transfer transistor 116-3, and transfer transistor 116-4. In various examples, an optional floating diffusion capacitance control signal FDC may also be included and is to be coupled to a capacitor 122, which is coupled to the floating diffusion 118. In one example the floating diffusion capacitance control signal FDC may be utilized to provide a boost control signal to the capacitors 122 coupled to the floating diffusions 118 as shown.

Transfer transistor 116-1 is coupled to be controlled in response to a transfer control signal TX1, transfer transistor 116-2 is coupled to be controlled in response to a transfer control signal TX2, transfer transistor 116-3 is coupled to be controlled in response to a transfer control signal TX3, and transfer transistor 116-4 is coupled to be controlled in response to a transfer control signal TX4. As such, charge photogenerated in photodiode 114-1 in response to incident light is transferred to floating diffusion 118 in response to transfer control signal TX1, charge photogenerated in photodiode 114-2 in response to incident light is transferred to floating diffusion 118 in response to transfer control signal TX2, charge photogenerated in photodiode 114-3 in response to incident light is transferred to floating diffusion 118 in response to transfer control signal TX3, and charge photogenerated in photodiode 114-4 in response to incident light is transferred to floating diffusion 118 in response to transfer control signal TX4.

As illustrated in the depicted example, a reset transistor 120 is coupled between a voltage supply (e.g., AVDD) and the floating diffusion 118. A gate of a source follower transistor 124 is coupled to the floating diffusion 118. The drain of the source follower transistor 124 is coupled to a voltage supply (e.g., AVDD). A row select transistor 126 is coupled to a source of the source follower transistor 124. In operation, the row select transistor 126 is coupled to output a data signal (e.g., image data or focus data) from the source follower transistor 124 of pixel circuit 104 to a bit line 112 in response to a row select signal RS.

In various examples, some or all of the photodiodes 114-1, 114-2, 114-3, and 114-4 may be configured as image sensing photodiodes included in a color pixel array, and some or all of the photodiodes 114-1, 114-2, 114-3, and 114-4 may be configured as phase detection autofocus photodiodes depending on the specific location of the pixel circuit 104 within the pixel array.

In such an example, the incident light that is directed to the photodiodes 114-1, 114-2, 114-3, and 114-4 that are configured as image sensing photodiodes is directed through respective color filters of a color filter array before reaching the photodiodes 114-1, 114-2, 114-3, and 114-4. In one example, the color filter array may be a Bayer color filter. Thus, the incident light may be directed through a red color filter, or a green color filter, or a blue color filter before reaching the photodiodes 114-1, 114-2, 114-3, and 114-4 that are configured as image sensing photodiodes.

In various examples, the incident light that is directed to the photodiodes 114-1, 114-2, 114-3, and 114-4 that are configured as phase detection autofocus photodiodes is directed through a microlens prior reaching the respective photodiodes 114-1, 114-2, 114-3, and 114-4. In the various examples, other than the incident light being directed through either a color filter or through a microlens, the photodiodes 114-1, 114-2, 114-3, and 114-4 are otherwise substantially similar.

In various examples, the photodiodes of the pixel array are binned, including photodiodes 114-1, 114-2, 114-3, and 114-4. As such, the information generated from each photodiode is summed with information generated from one or more nearby binned photodiodes to generate combined information, and therefore sum the performance of each individual photodiode to improve the performance of the pixel array. For instance, in various examples, 2×2 groupings of photodiodes are configured to be binned such that the 4 photodiodes included in each grouping all share the same color. In other words, the photodiodes are arranged in the pixel array such that each 2×2 grouping of image sensing photodiodes is either red, green, or blue. In one example, the 2×2 groupings of binned photodiodes are all adjacent photodiodes in the pixel array and share the same color filter. In one example, the 2×2 groupings of binned photodiodes may all share the same color, but each two photodiodes that have the same color are separated from one another by another photodiode having a different color.

In various examples, phase detection autofocus photodiodes are grouped in 2×2 groupings, which are interspersed among image sensing photodiodes, share a microlens. In another example, phase detection autofocus photodiodes are grouped in 2×1 groupings that share a microlens and are interspersed among image sensing photodiodes of a color pixel array.

Figure 2:
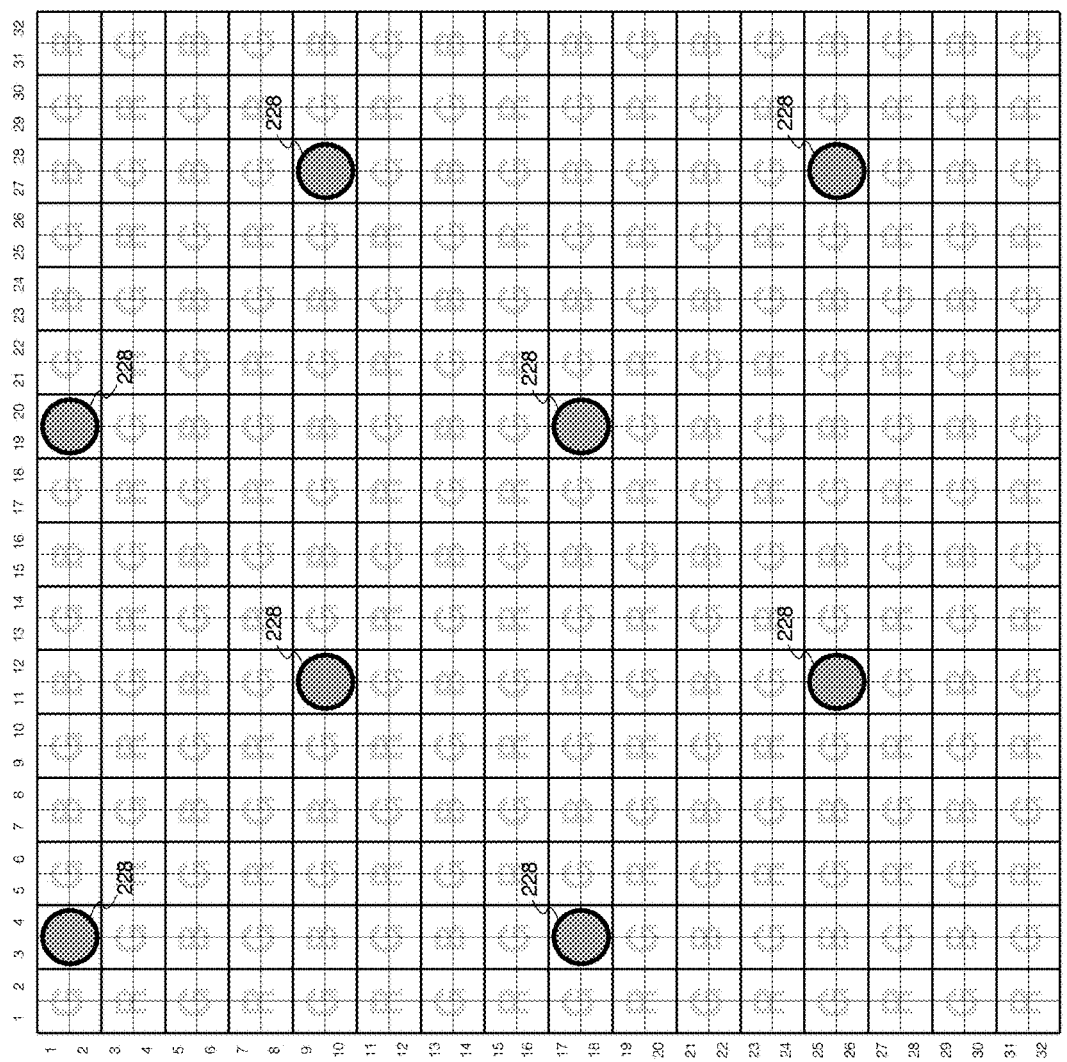
FIG. 2 illustrates a one example of a color pixel array with an array of photodiodes including phase detection autofocus photodiodes interspersed among binned image sensing photodiodes in accordance with the teachings of the present disclosure.

FIG. 2 illustrates a one example of a color pixel array 202 with an array of photodiodes including phase detection autofocus photodiodes interspersed among binned image sensing photodiodes in accordance with the teachings of the present disclosure. In particular, the depicted example illustrates color pixel array 202 shows a 2×2 phase detection autofocus (PDAF) pattern with a 4C color filter. In the example, Bayer binning is provided with 2×2 groupings of red (R) color filters, 2×2 groupings of green (G) color filters, and 2×2 groupings of blue (B) color filters, which are disposed over image sensing photodiodes. The example also illustrates microlenses 228 disposed over PDAF photodiodes, which are interspersed among the imaging sensing photodiodes of color pixel array 202.

For each 2×2 grouping of PDAF pixels, microlenses 228 are shown in FIG. 2, which cover the underlying 2×2 grouping of PDAF pixels. In the example, for the normal image sensing pixels under the color filters, the microlenses are not shown so as not to obscure the teachings of the present invention. In one example, the microlenses for the normal image sensing pixels may only cover a 1×1 pixel or photodiode area.

In operation, phase detection information is retrieved by comparing the signals from one side of the 2×2 groupings of the PDAF signals with signals from the other side of the groupings of the PDAF pixels. For instance, in one example, the signals from the left side pair of pixels are compared with the signals from the right side pair of pixels of the 2×2 groupings of PDAF pixels. In another example, the signals from the top side pair of pixels are compared with the signals from the bottom side pair of pixels of the 2×2 groupings of PDAF pixels. In still another example with 2×1 groupings of PDAF pixels, the signals from the left side pixels are compared with the signals from the right side pixels of the 2×1 groupings of PDAF pixels.

In prior designs, PDAF pixels share same TX wires as normal image sensing pixels from the same row. Thus, both PDAF pixels and normal image sensing pixels are read out in the same manner. In 4C mode, which is when the image sensing pixels are binned in 2×2 arrays for each color as shown to obtain phase detection information for PDAF pixel support. As such, the left two photodiodes of each 2×2 grouping of PDAF pixels are read at one time, and the right two photodiodes of each 2×2 grouping of PDAF pixels are read at a different time (for horizontal phase detection), assuming the same number of column analog to digital conversion (ADC) circuits are available. Consequently, compared to reading out the 2×2 binned pixels all at once using the same number of column ADC circuits, the phase detection information from the 2×2 PDAF photodiodes can only be read out at half the frame rate since the left and right PDAF photodiodes are read out separately at different times. Thus, in order to boost the frame rate, more power consumption would be required.

Due to the different preferred sensitivities of PDAF photodiodes from normal image sensing photodiodes, it may also be preferred to have different exposure time control for the PDAF photodiodes from the normal image sensing photodiodes. However, in prior designs, except for the difference of being disposed under a color filter or a microlens, the PDAF photodiodes are wired exactly the same as the normal image sensing photodiodes. In other words, in prior designs, the normal image sensing pixels and the PDAF pixels share the same transfer control wires in the same row, and therefore their exposure control and read outs are the same as well. Consequently, in prior designs, it is not possible to have different exposure time control as the PDAF pixels are always read out the same way as normal image sensing pixels from the same row. Therefore, as will be discussed in detail below, examples in accordance with teachings of the present invention disclose pixel arrays with pixel circuitry in which at least some of the transfer transistors coupled to the phase detection autofocus photodiodes may be controlled separately from the image sensing photodiodes in the same row of the array of photodiodes of an image sensor, which provides flexible exposure control, high speed, and low power consumption for the image sensor in accordance with the teachings of the present invention.

Figure 3A:
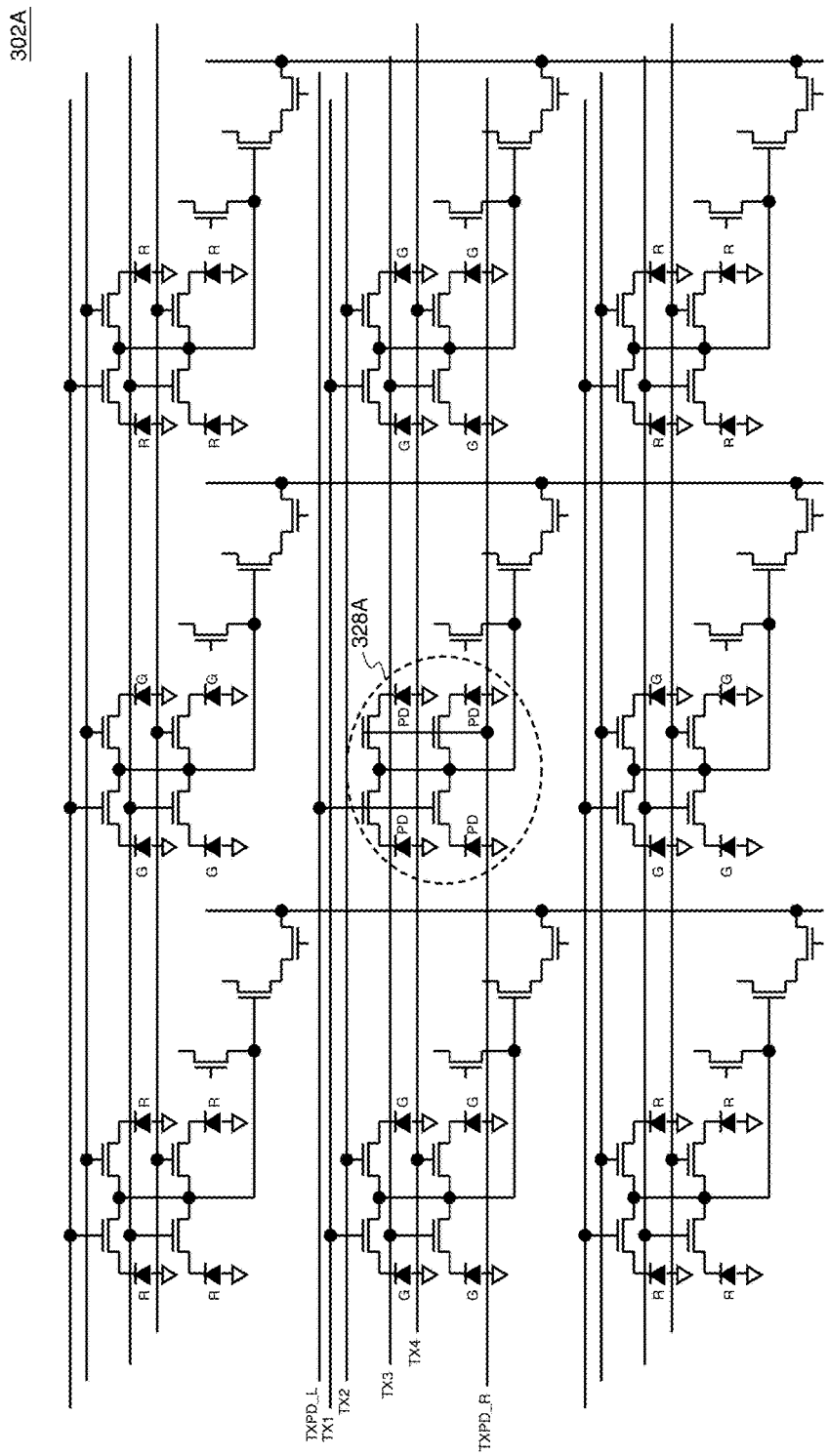
FIG. 3A shows one example of a schematic of a color pixel array including an array of photodiodes with phase detection autofocus photodiodes interspersed among binned image sensing photodiodes in accordance with the teachings of the present disclosure.

To illustrate, FIG. 3A shows one example of a schematic of a pixel array 302A including an array of photodiodes with phase detection autofocus photodiodes interspersed among binned image sensing photodiodes in accordance with the teachings of the present disclosure. It is appreciated the pixel array 302A of FIG. 3A may be an example of a pixel circuitry included in the of the pixel array 202 as shown in FIG. 2 or the pixel array 102 as shown in FIGS. 1A-1B, and that similarly named and numbered elements described above are coupled and function similarly below, and that similarly named and numbered elements described above are coupled and function similarly below.

The portion of pixel array 302A depicted in FIG. 3A shows 6 rows and 6 columns of photodiodes. It is appreciated that in other embodiments, the pixel array 302A may include a greater number of rows and columns. As shown in the the depicted example, the photodiodes are arranged in 2×2 groupings. In the example, the left column of 2×2 groupings share a first bit line, the center column of 2×2 groupings share a second bit line, and the right column of 2×2 groupings share a third bit line.

The depicted example shows that the center row of 2×2 groupings include transfer transistors that are coupled to be controlled in response to transfer control signals TX1, TX2, TX3, and TX4. It is noted that the upper row of 2×2 groupings include transfer transistors that are similarly coupled to be controlled in response to respective transfer control signals (not labeled) for the upper row 2×2 groupings, and that the bottom row of 2×2 groupings include transfer transistors that are similarly coupled to be controlled in response to respective transfer control signals (not labeled) for the bottom row of 2×2 groupings.

In the depicted example, the upper left, the upper right, the lower left, and the lower right 2×2 groupings of photodiodes are configured to receive red light. The upper center, the center left, the center right, and the lower center 2×2 groupings of photodiodes are configured to receive green light. The center 2×2 grouping of photodiodes are configured as PDAF photodiodes. A microlens 328A is illustrated over the PDAF photodiodes with dashed lines in the illustrated example.

The example depicted in FIG. 3A includes two extra control lines that control the transfer transistors coupled to the PDAF photodiodes to support horizontal phase detection. In particular, the TXPD_L control line is coupled to control the left two PDAF photodiodes of the center 2×2 grouping, and the TXPD_R control line is coupled to control the right two PDAF photodiodes of the center 2×2 grouping.

With the independent TXPD_L and TXPD_R control wires for the left PDAF photodiodes and right photodiodes, the example pixel array 302A provides the flexibility to read out PDAF photodiodes of the center 2×2 grouping differently from the normal image sensing photodiodes of the other 2×2 groupings shown in FIG. 3A. In this way, the normal image sensing photodiodes can be read out all at once with all of the photodiodes of the 2×2 groupings binned as illustrated, while the PDAF photodiodes in the center 2×2 grouping can be read out two times at a different time from the normal image sensing photodiodes, in response to the TXPD_L and TXPD_R control wires in accordance with the teachings of the present invention. For example, in the first readout, the left PDAF photodiodes may be read out through the second bit line (e.g., the center bit line in FIG. 3A) in response to the TXPD_L signal, and in the second readout, the right PDAF photodiodes may be read out through the second bit line in FIG. 3A in response to the TXPD_R signal. In another example, it is appreciated that the specific order of the read outs may be reversed.

Figure 3B:
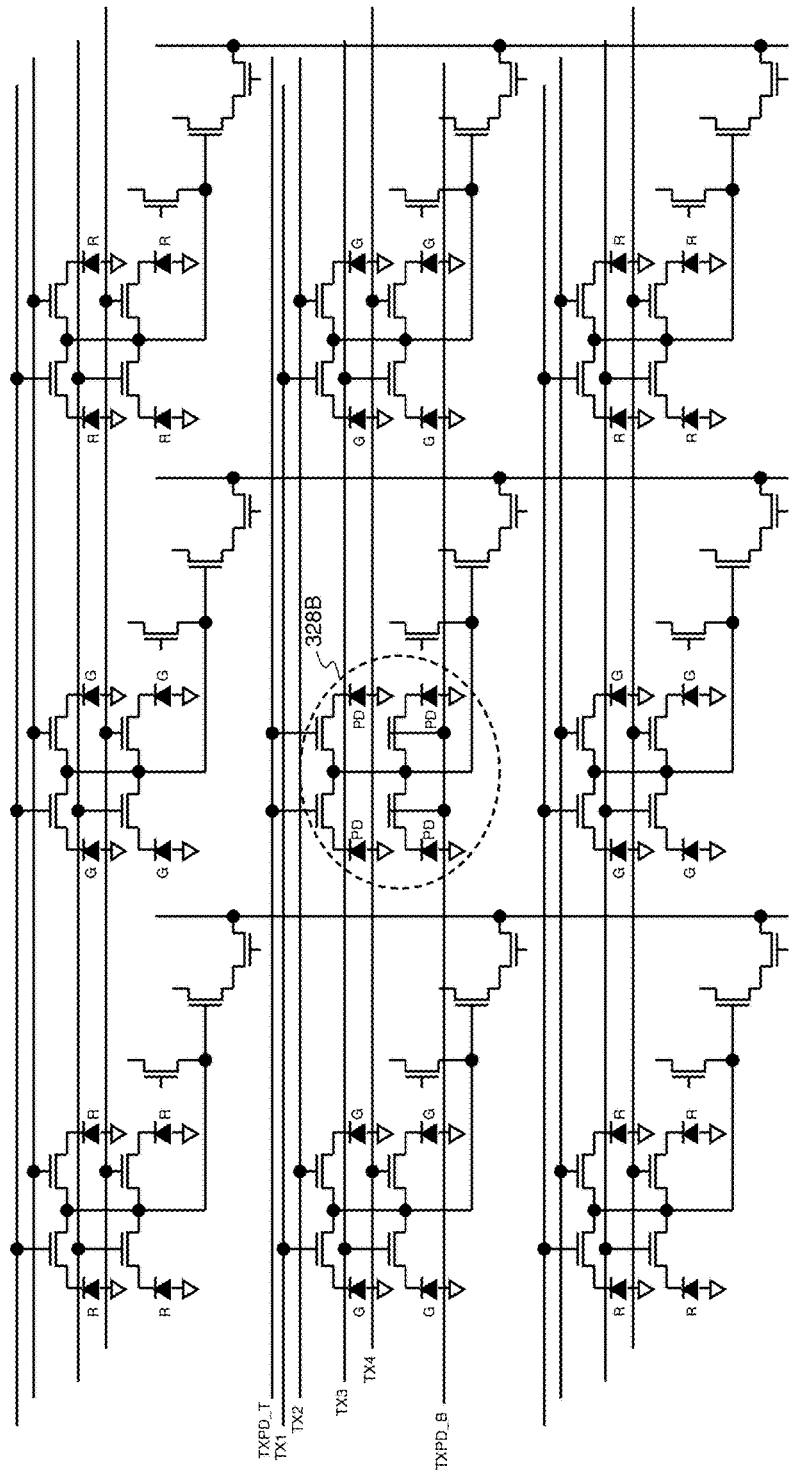
FIG. 3B illustrates another example of a schematic of a color pixel array including an array of photodiodes with phase detection autofocus photodiodes interspersed among binned image sensing photodiodes in accordance with the teachings of the present disclosure.

FIG. 3B shows another example of a schematic of a pixel array 302B including an array of photodiodes with phase detection autofocus photodiodes interspersed among binned image sensing photodiodes in accordance with the teachings of the present disclosure. It is appreciated the pixel array 302B of FIG. 3B may also be an example of a pixel circuitry included in the of the pixel array 202 as shown in FIG. 2 or the pixel array 102 as shown in FIGS. 1A-1B, and that similarly named and numbered elements described above are coupled and function similarly below. It is further appreciated that pixel array 302B of FIG. 3B shares many similarities with pixel array 302A of FIG. 3A.

For instance, the portion of pixel array 302B depicted in FIG. 3B also shows 6 rows and 6 columns of photodiodes. It is appreciated that in other embodiments, the pixel array 302B may include a greater number of rows and columns. As shown in the depicted example, the photodiodes are arranged in 2×2 groupings. In the example, the left column of 2×2 groupings share a first bit line, the center column of 2×2 groupings share a second bit line, and the right column of 2×2 groupings share a third bit line.

The depicted example shows that the center row of 2×2 groupings include transfer transistors that are coupled to be controlled in response to transfer control signals TX1, TX2, TX3, and TX4. It is noted that the upper row of 2×2 groupings include transfer transistors that are similarly coupled to be controlled in response to respective transfer control signals (not labeled) for the upper row 2×2 groupings, and that the bottom row of 2×2 groupings include transfer transistors that are similarly coupled to be controlled in response to respective transfer control signals (not labeled) for the bottom row of 2×2 groupings.

In the depicted example, the upper left, the upper right, the lower left, and the lower right 2×2 groupings of photodiodes are configured to receive red light. The upper center, the center left, the center right, and the lower center 2×2 groupings of photodiodes are configured to receive green light. The center 2×2 grouping of photodiodes are configured as PDAF photodiodes. A microlens 328B is illustrated over the PDAF photodiodes with dashed lines in the illustrated example.

The example depicted in FIG. 3B includes two extra control lines that control the transfer transistors coupled to the PDAF photodiodes to support vertical phase detection. In particular, the TXPD_T control line is coupled to control the top two PDAF photodiodes of the center 2×2 grouping, and the TXPD_B control line is coupled to control the bottom two PDAF photodiodes of the center 2×2 grouping for vertical phase detection.

With the independent TXPD_T and TXPD_B control wires for the top PDAF photodiodes and bottom photodiodes, the example pixel array 302B also provides the flexibility to read out PDAF photodiodes of the center 2×2 grouping differently from the normal image sensing photodiodes of the other 2×2 groupings shown in FIG. 3B. In this way, the normal image sensing photodiodes can be read out all at once with all of the photodiodes of the 2×2 groupings binned as illustrated, while the PDAF photodiodes in the center 2×2 grouping can be read out two times at a different time from the normal image sensing photodiodes, in response to the TXPD_T and TXPD_B control wires in accordance with the teachings of the present invention. For example, in the first readout, the top PDAF photodiodes may be read out through the second bit line (e.g., the center bit line in FIG. 3B) in response to the TXPD_T signal, and in the second readout, the bottom PDAF photodiodes may be read out through the center bit line in FIG. 3B in response to the TXPD_B signal. In another example, it is appreciated that the specific order of the read outs may be reversed.

Referring back to the example shown in FIG. 2, for the 2×2 PDAF pattern shown in pixel array 202, the PDAF photodiode density is $\frac{1}{32}$. In particular, for every eight rows, there are two PDAF rows (i.e., rows with PDAF photodiodes). For every eight columns, there are two PDAF columns (i.e., columns with PDAF photodiodes). Considering the arrangement of the 2×2 groupings with two bit lines per shared pixel and with two half row column analog to digital (ADC) circuits, four pixel rows can be read out at one time. For the 32×32 pattern example illustrated FIG. 2, the pattern may be read out in eight timing rows.

To illustrate, as shown in the example of FIG. 2, the 2×2 grouping of PDAF photodiodes in rows 1 and 2 are located in columns 3 and 4. The 2×2 grouping of PDAF photodiodes in rows 9 and 10 are located in columns 11 and 12. These 2×2 groupings of PDAF photodiodes can be read out at the same time as they are using different bit lines and therefore different column ADC circuits. For the 32×32 pattern shown in FIG. 2, with a two bit line and two-half row read out ADC structure, all PD rows in this 32×32 pattern can be read out at one time, using existing column ADC circuits. As it requires two readouts for the left and right photodiodes of the 2×2 grouping of PDAF photodiodes, for the 32×32 pattern in FIG. 2, the PDAF information is read out in two timing rows. Compared to the normal image sensing photodiode rows, it is $\frac{1}{4}$th the timing.

Figure 4:
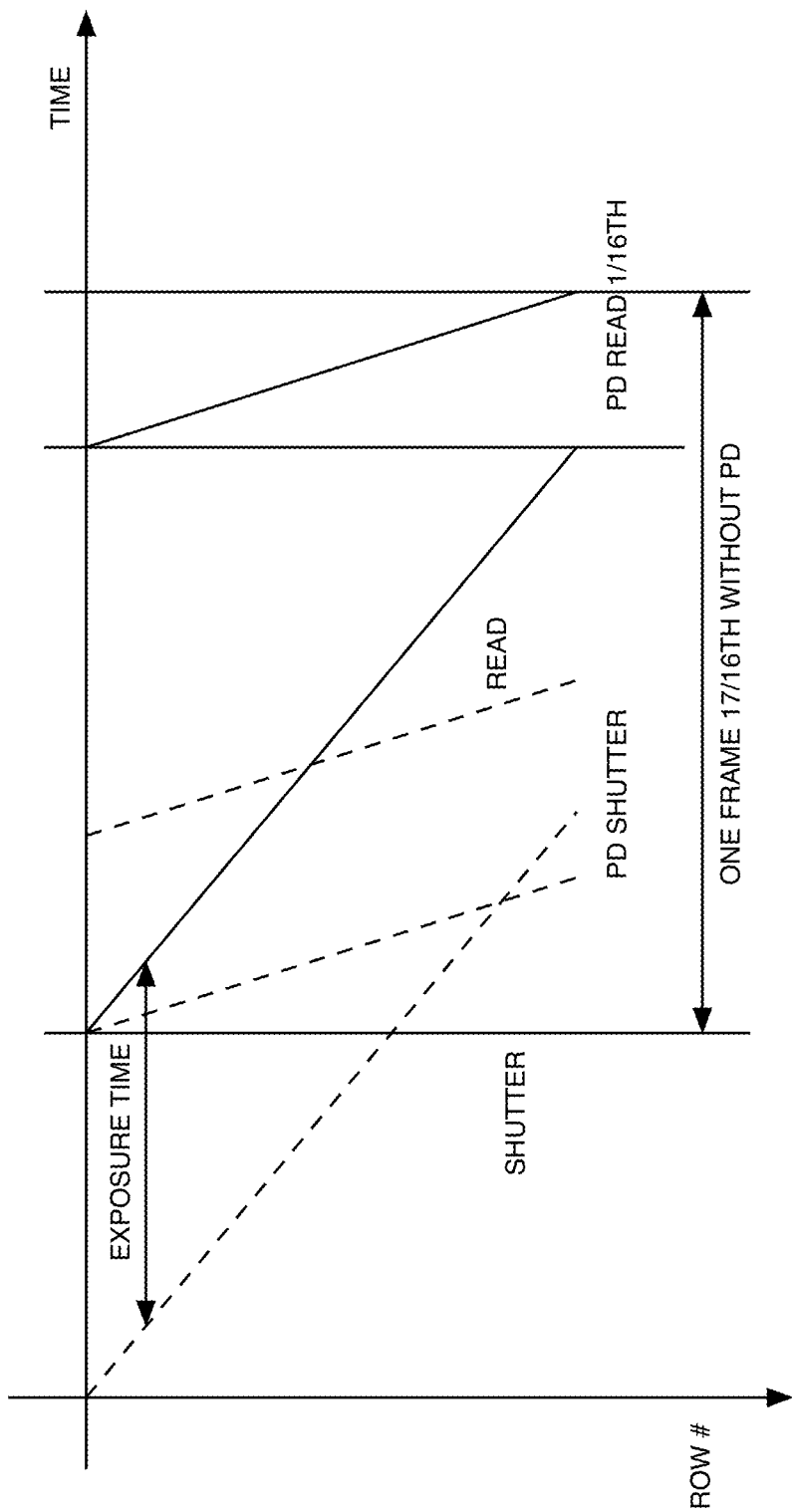
FIG. 4 is an example timing diagram that illustrates the exposure time and read out time of a color pixel array with an array of photodiodes including phase detection autofocus photodiodes interspersed among binned image sensing photodiodes in accordance with the teachings of the present disclosure.

FIG. 4 is an example timing diagram that shows the frame timing with TXPD controls (e.g., TXPD_L and TXPD_R, or TXPD_T and TXPD_B) shown in FIGS. 3A-3B in accordance with the teachings of the present disclosure. With the individual exposure control for the PDAF photodiodes provided with the TXPD controls shown in FIGS. 3A-3B, all PDAF information may be read out after the normal image sensing photodiodes have been read out. This can be referred to herein as a PD mini-frame following a normal image frame. Assuming a normal read out time for one frame is "1", the extra time required to read out the PD mini-frame is "$\frac{1}{4}$th", following the analysis above. In FIG. 4, a "best case" is depicted when the PD mini-frame time only costs "$\frac{1}{16}$th" of the normal frame time.

Figure 5:
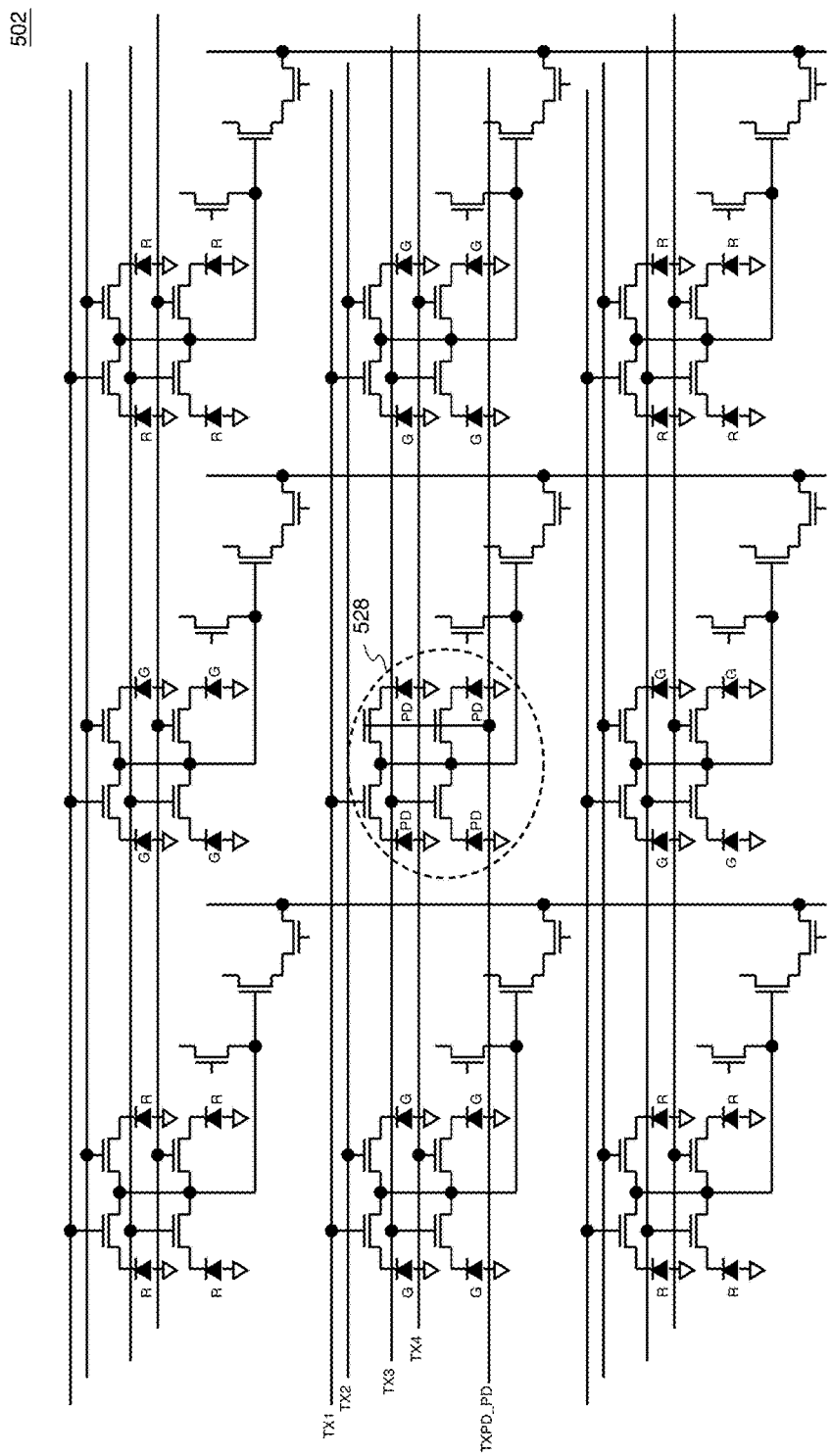
FIG. 5 illustrates yet another example of a schematic of a color pixel array including an array of photodiodes with phase detection autofocus photodiodes interspersed among binned image sensing photodiodes in accordance with the teachings of the present disclosure.

FIG. 5 illustrates yet another example of a schematic of a color pixel array 502 including an array of photodiodes with phase detection autofocus photodiodes interspersed among binned image sensing photodiodes in accordance with the teachings of the present disclosure. It is appreciated the pixel array 502 of FIG. 5 may also be an example of a pixel circuitry included in the of the pixel array 202 as shown in FIG. 2 or the pixel array 102 as shown in FIGS. 1A-1B, and that similarly named and numbered elements described above are coupled and function similarly below. It is further appreciated that pixel array 502 of FIG. 5 shares many similarities with pixel array 302B of FIG. 3B and/or with pixel array 302A of FIG. 3A.

For instance, the portion of pixel array 502 depicted in FIG. 5 also shows 6 rows and 6 columns of photodiodes. It is appreciated that in other embodiments, the pixel array 502 may include a greater number of rows and columns. As shown in the depicted example, the photodiodes are arranged in 2×2 groupings. In the example, the left column of 2×2 groupings share a first bit line, the center column of 2×2 groupings share a second bit line, and the right column of 2×2 groupings share a third bit line.

The depicted example shows that the center row of 2×2 groupings include transfer transistors that are coupled to be controlled in response to transfer control signals TX1, TX2, TX3, and TX4. It is noted that the upper row of 2×2 groupings include transfer transistors that are similarly coupled to be controlled in response to respective transfer control signals (not labeled) for the upper row 2×2 groupings, and that the bottom row of 2×2 groupings include transfer transistors that are similarly coupled to be controlled in response to respective transfer control signals (not labeled) for the bottom row of 2×2 groupings.

In the depicted example, the upper left, the upper right, the lower left, and the lower right 2×2 groupings of photodiodes are configured to receive red light. The upper center, the center left, the center right, and the lower center 2×2 groupings of photodiodes are configured to receive green light. The center 2×2 grouping of photodiodes are configured as PDAF photodiodes. A microlens 528 is illustrated over the PDAF photodiodes with dashed lines in the illustrated example.

One difference between pixel array 502 of FIG. 5 and pixel array 302B of FIG. 3B and/or pixel array 302A of FIG. 3A is that in the example depicted in FIG. 5 pixel array 502 includes only one extra control line (instead of two as in FIGS. 3A-3B) that is coupled control the transfer transistors coupled to the PDAF photodiodes to support horizontal phase detection. In the specific example depicted in FIG. 5, the TXPD_PD control line is coupled to control the transfer transistors coupled to the right two PDAF photodiodes of the center 2×2 grouping. In another example, it is appreciated that the TXPD_PD control line could be coupled to control the transfer transistors coupled to the left two PDAF photodiodes of the center 2×2 grouping. Referring back to the example depicted in FIG. 5, the transistors coupled to the left two PDAF photodiodes of the center 2×2 grouping are coupled to be controlled in response to the TX1 and TX3 transfer control signals that are used to control the other respective normal imaging sensing photodiodes in the other 2×2 groupings in the same row. As such, in the example, the two left PDAF photodiodes of the center 2×2 grouping may be read out in response to the TX1 and TX3 transfer control signals through the center bit line at the same time as the other normal image sensing photodiodes of the same row are read out. However, the two right PDAF photodiodes of the center 2×2 grouping may be read out at a different time in response to the TXPD_PD transfer control signal in accordance with the teachings of the present invention.

With the separate or independent TXPD_PD control wire for the right PDAF photodiodes as shown in FIG. 5, the example pixel array 502 also provides the flexibility to read out the right PDAF photodiodes of the center 2×2 grouping while the normal image sensing photodiodes and the left PDAF photodiodes can be read out at the same time in accordance with the teachings of the present invention. For example, in a first readout, the left PDAF photodiodes may be read out through the second bit line (e.g., the center bit line in FIG. 5) at the same time as the other normal image sensing photodiodes in the row in response to the TX1 and TX3 transfer control signals. In the second readout, the right PDAF photodiodes may be read out through the center bit line in FIG. 5 in response to the TXPD_PD signal.

Thus, it is appreciated that in the example pixel array 502 of FIG. 5, half of the PDAF photodiodes are read out along with normal image sensing photodiodes in the same row, and the remaining PDAF photodiodes are read out separately during a PD mini-frame or interleaved PDAF frame, as will be discussed in greater detail below. As a result, the additional time required to read out the PDAF photodiodes is reduced by 50% and only one additional TXPD control line is required, instead of two additional TXPD control lines (e.g., TXPD_L and TXPD_R, or TXPD_T and TXPD_B) as illustrated in the previous examples shown in FIGS. 3A-3B. With fewer additional control wires to route, it is easier to lay out the pixel when adding the additional control wires (e.g., TXPD).

Figure 6:
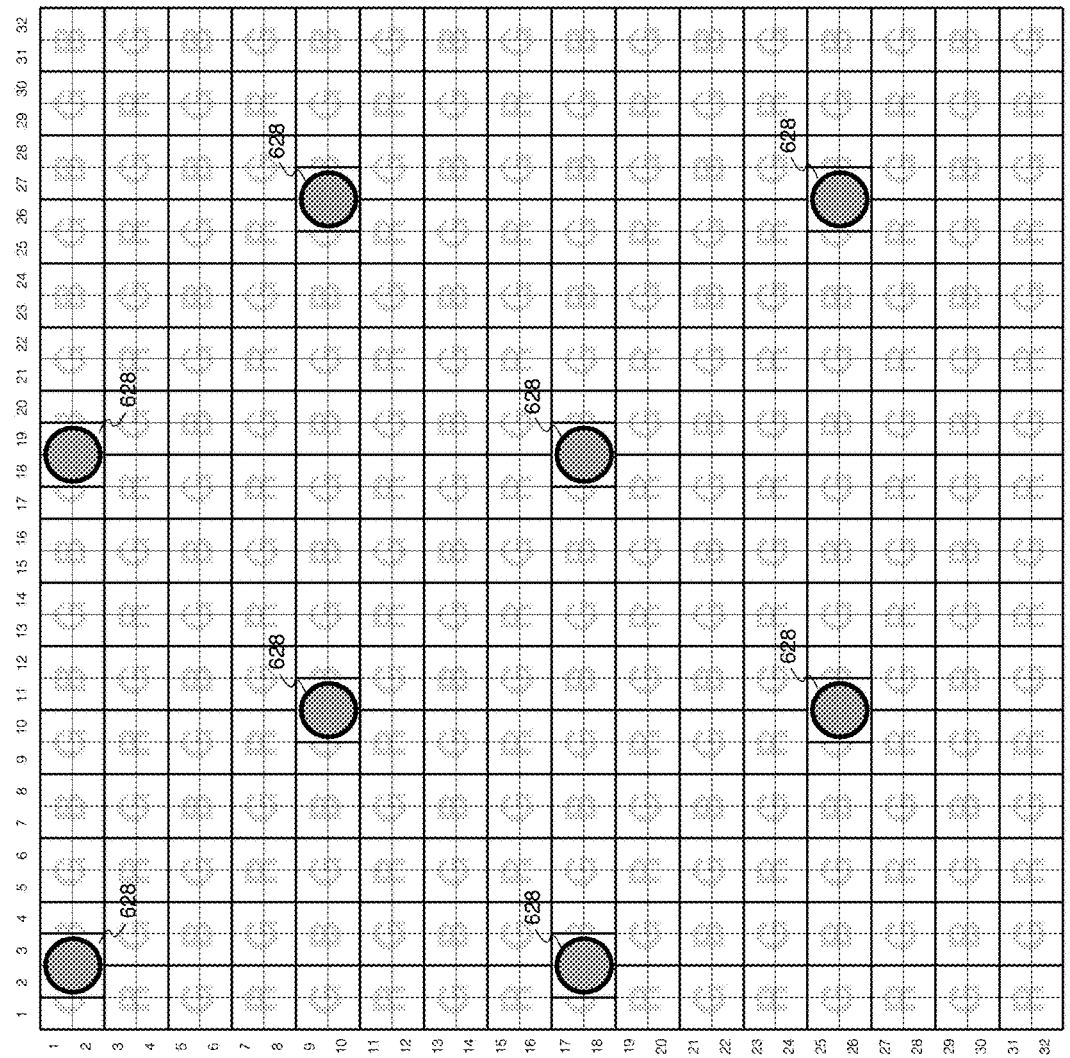
FIG. 6 illustrates another example of a color pixel array with an array of photodiodes including phase detection autofocus photodiodes interspersed among binned image sensing photodiodes in accordance with the teachings of the present disclosure.

FIG. 6 illustrates another example of a color pixel array 602 with an array of photodiodes including phase detection autofocus photodiodes interspersed among binned image sensing photodiodes in accordance with the teachings of the present disclosure. It is appreciated the color pixel array 602 shown of FIG. 6 shares similarities with the color pixel array 202 shown in FIG. 2, and that similarly named and numbered elements described above are coupled and function similarly below.

For instance, FIG. 6 also illustrates the color pixel array 602 with a 2×2 phase detection autofocus (PDAF) pattern with a 4C color filter. In the example, Bayer binning is provided with 2×2 groupings of red (R) color filters, 2×2 groupings of green (G) color filters, and 2×2 groupings of blue (B) color filters, which are disposed over image sensing photodiodes. The example also illustrates microlenses 628 disposed over PDAF photodiodes, which are interspersed among the imaging sensing photodiodes of color pixel array 602. For each 2×2 grouping of PDAF pixels, the microlenses 628 are shown in FIG. 6, which covers the 2×2 area, while for the normal image sensing pixels under the color filters, the microlenses are not shown so as not to obscure the teachings of the present invention. In one example, the microlenses for the normal image sensing pixels only cover a 1×1 pixel area.

In operation, phase detection information is retrieved by comparing the signals from one side (e.g., left side) of the 2×2 groupings of the PDAF signals with signals from the other side (e.g., right side) of the 2×2 groupings of the PDAF pixels. One difference between color pixel array 602 of FIG. 6 and color pixel array 202 of FIG. 2 is that in color pixel array 602 of FIG. 6, the PDAF pattern of the 2×2 groupings of PDAF photodiodes (i.e., under microlenses 628) is shifted by one pixel or one photodiode (e.g., one pixel to the left in FIG. 6). Thus, for horizontal phase detection, the number of extra TXPD control wires is reduced to one TXPD control wire in accordance with the teachings of the present invention. As such, the left PDAF photodiodes under microlenses 628 may be read out at the same time as the right PDAF photodiodes under microlenses 628 through respective bit lines.

Figure 7:
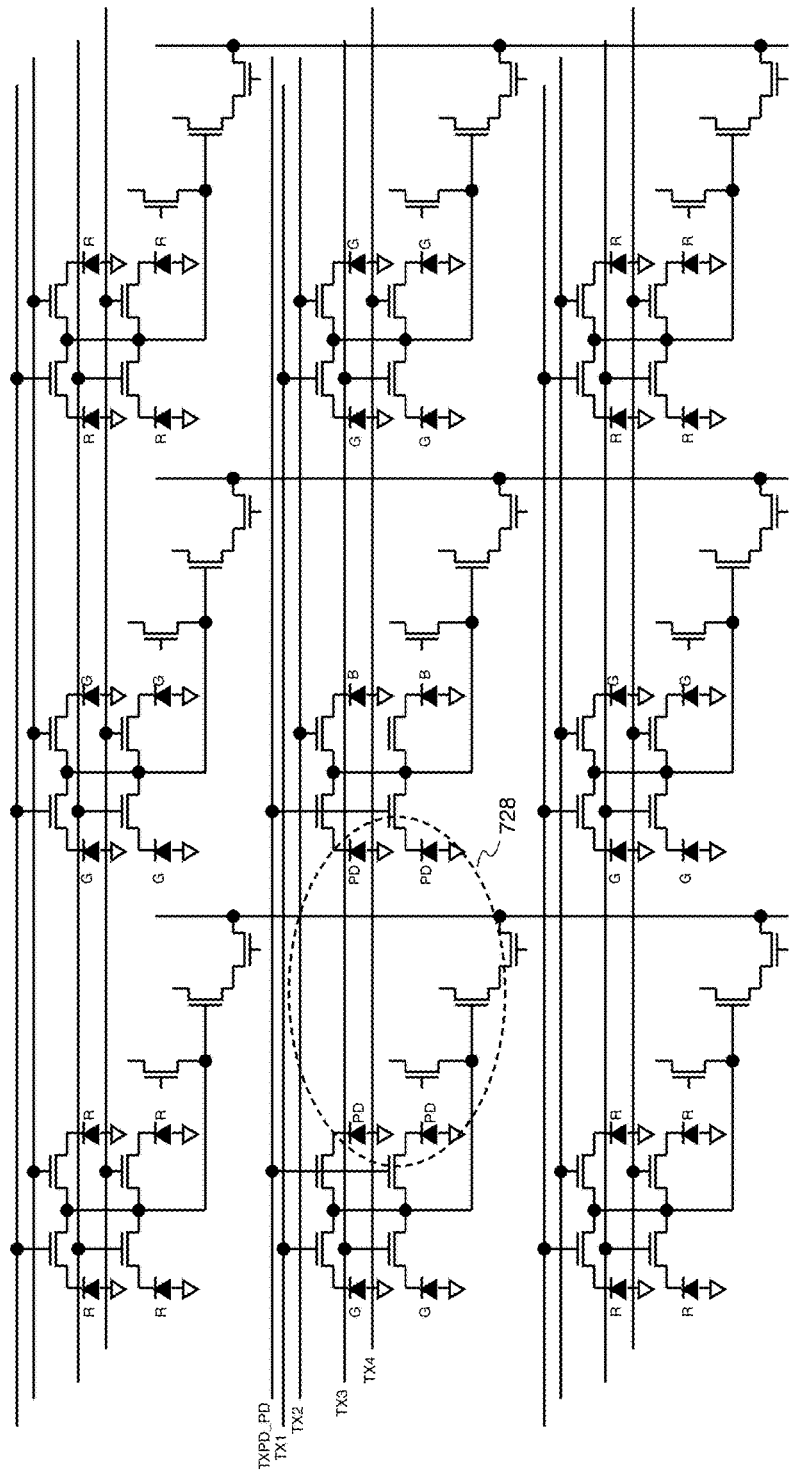
FIG. 7 illustrates still another example of a schematic of a color pixel array including an array of photodiodes with phase detection autofocus photodiodes interspersed among binned image sensing photodiodes in accordance with the teachings of the present disclosure.

To illustrate, FIG. 7 illustrates an example of a schematic of a color pixel array 702 including an array of photodiodes with phase detection autofocus photodiodes in a pattern that is shifted by one, and interspersed among binned image sensing photodiodes as discussed above with respect to FIG. 6 in accordance with the teachings of the present disclosure. It is appreciated the schematic of color pixel array 702 shown of FIG. 7 shares many similarities with the schematics of color pixel arrays shown previously in FIGS. 3A, 3B and 5, and that similarly named and numbered elements described above are coupled and function similarly below.

For instance, the portion of the schematic of pixel array 702 depicted in FIG. 7 also shows 6 rows and 6 columns of photodiodes. It is appreciated that in other embodiments, the pixel array 702 may include a greater number of rows and columns. As shown in the depicted example, the photodiodes are arranged in 2×2 groupings. In the example, the left column of 2×2 groupings share a first bit line, the center column of 2×2 groupings share a second bit line, and the right column of 2×2 groupings share a third bit line. The depicted example shows that the center row of 2×2 groupings include transfer transistors that are coupled to be controlled in response to transfer control signals TX1, TX2, TX3, and TX4. It is noted that the upper row of 2×2 groupings include transfer transistors that are similarly coupled to be controlled in response to respective transfer control signals (not labeled) for the upper row 2×2 groupings, and that the bottom row of 2×2 groupings include transfer transistors that are similarly coupled to be controlled in response to respective transfer control signals (not labeled) for the bottom row of 2×2 groupings.

In the depicted example, the upper left, the upper right, the lower left, and the lower right 2×2 groupings of photodiodes are configured to receive red light. The upper center, the right center, and the lower center 2×2 groupings of photodiodes are configured to receive green light. With the shifted PDAF pixel scheme of pixel array 702 depicted in FIG. 7, the left pair of the 2×2 groupings of photodiodes in the left center 2×2 grouping of photodiodes is configured to receive green light, and the right pair of the 2×2 grouping of photodiodes in the center 2×2 grouping of photodiodes is configured to receive blue light. In addition, with the shifted PDAF pixel scheme of pixel array 702 depicted in FIG. 7, the right pair of the 2×2 grouping of photodiodes in the left center 2×2 grouping of photodiodes and the left pair of the 2×2 grouping of photodiodes in the center 2×2 grouping of photodiodes, which are indicated with the dashed line 728 representing the PDAF microlens, are configured as PDAF photodiodes.

Thus, for horizontal phase detection, with the shifted PDAF pixel scheme of pixel array 702 depicted in FIG. 7, only one additional PDAF control signal TXPD_PD is coupled to control all four of the PDAF photodiodes within dashed line 728. The left pair of PDAF photodiodes within dashed line 728 can be read out through the left or first bit line at the same time as the right pair PDAF photodiodes within dashed line 728 are read out through the center or second bit line. Assuming for example a 32×32 color pixel array 602 pattern as shown in FIG. 6, the phase detection information may be read out in one timing row. It is appreciated therefore that if the normal read out time for a normal 4C configuration for one frame is "1", then the additional time required to read out the PD mini-frame as disclosed in FIGS. 6-7 is an additional "$1/8^{th}$" of a frame.

Figure 8:
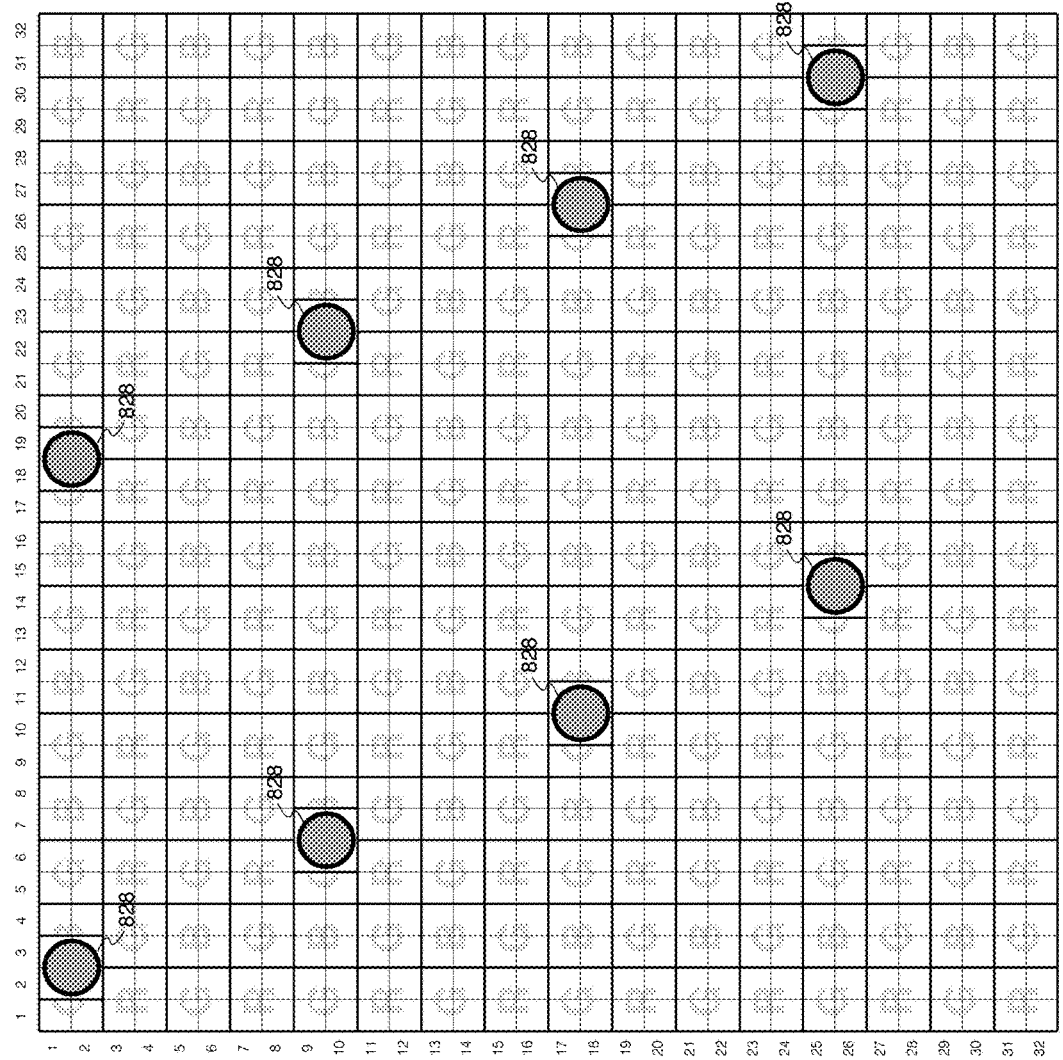
FIG. 8 illustrates yet another example of a color pixel array with an array of photodiodes including phase detection autofocus photodiodes interspersed among binned image sensing photodiodes in accordance with the teachings of the present disclosure.

FIG. 8 illustrates another example of a color pixel array 802 including an array of photodiodes with phase detection autofocus photodiodes in a pattern that is shifted by one and interspersed among binned image sensing photodiodes as discussed above with respect to FIG. 6 in accordance with the teachings of the present disclosure. It is appreciated the color pixel array 802 shown of FIG. 8 shares many similarities with the color pixel arrays shown previously in FIGS. 2 and 6, and that similarly named and numbered elements described above are coupled and function similarly below.

For instance, FIG. 8 also illustrates the color pixel array 802 with a 2×2 phase detection autofocus (PDAF) pattern with a 4C color filter. In the example, Bayer binning is provided with 2×2 groupings of red (R) color filters, 2×2 groupings of green (G) color filters, and 2×2 groupings of blue (B) color filters, which are disposed over image sensing photodiodes. The example also illustrates microlenses 828 disposed over PDAF photodiodes, which are interspersed among the imaging sensing photodiodes of color pixel array 802. For each 2×2 grouping of PDAF pixels, the microlenses 828 are shown in FIG. 8, which covers the 2×2 area, while for the normal image sensing pixels under the color filters, the microlenses are not shown so as not to obscure the teachings of the present invention. In one example, the microlenses for the normal image sensing pixels only cover a 1×1 pixel area. In operation, horizontal phase detection information is retrieved by comparing the signals from one side (e.g., left side) of the 2×2 groupings of the PDAF signals with signals from the other side (e.g., right side) of the 2×2 groupings of the PDAF pixels in the illustrated example.

Similar to color pixel array 602 of FIG. 6, one difference between color pixel array 802 of FIG. 8 and color pixel array 202 of FIG. 2 is that in color pixel array 802 of FIG. 8, the PDAF pattern of the 2×2 groupings of PDAF photodiodes (i.e., under microlenses 828) is shifted by one pixel or one photodiode (e.g., one pixel to the left in FIG. 8). Thus, for horizontal phase detection, the number of extra TXPD control wires is reduced to one TXPD control wire in accordance with the teachings of the present invention. Thus, the left PDAF photodiodes under microlenses 828 may be read out at the same time as the right PDAF photodiodes under microlenses 828 through respective bit lines.

However, one difference between color pixel array 802 of FIG. 8 and color pixel array 602 of FIG. 6 is that in color pixel array 802 of FIG. 8, the time required to read out the PDAF information from pixel array 802 is further reduced by further shifting some of the PDAF rows so that more of bit lines can be utilized to read out multiple PDAF rows from pixel array 802 simultaneously. For instance, in the 32×32 pattern example shown in FIG. 8, each column bit line can be utilized to read out the respective pair of PDAF photodiodes coupled to the column bit line from different rows throughout the pixel array 802 at the same time. Therefore, all of the PDAF information of multiple PDAF rows, as indicated with microlenses 828 in the example in color pixel array 802 of FIG. 8, can be read out in one timing row, using only one bit line for each side (e.g., left side and right side) of each 2×2 PDAF grouping. With two bit lines per each 2×2 shared pixel, all PDAF information from the multiple PDAF rows will be able to be read out in one timing row for the pattern. It is appreciated therefore that if the normal read out time for a normal 4C configuration for one frame is "1", the extra time required to read out the PD mini-frame as shown in FIG. 8 is "$1/16^{th}$" of a frame.

It is appreciated that in the color pixel array 802 example of FIG. 8 where multiple PDAF rows are read out at the same time by arranging the PDAF patterns such that the PDAF photodiodes are read out are using different column bit lines, additional row select control wires coupled to control the row select transistors coupled to the PDAF photodiodes are also included as needed. In one example, the additional row select wires are utilized to ensure that the normal image sensor pixels in the PDAF row are not selected during a PDAF photodiode read out. As such, the bit lines coupled to the normal image sensor pixels in the PDAF row can be used for the PDAF photodiodes in another PDAF row, and the multiple PDAF rows can therefore be read out at the same time in accordance with the teachings of the present invention.

Figure 9A:
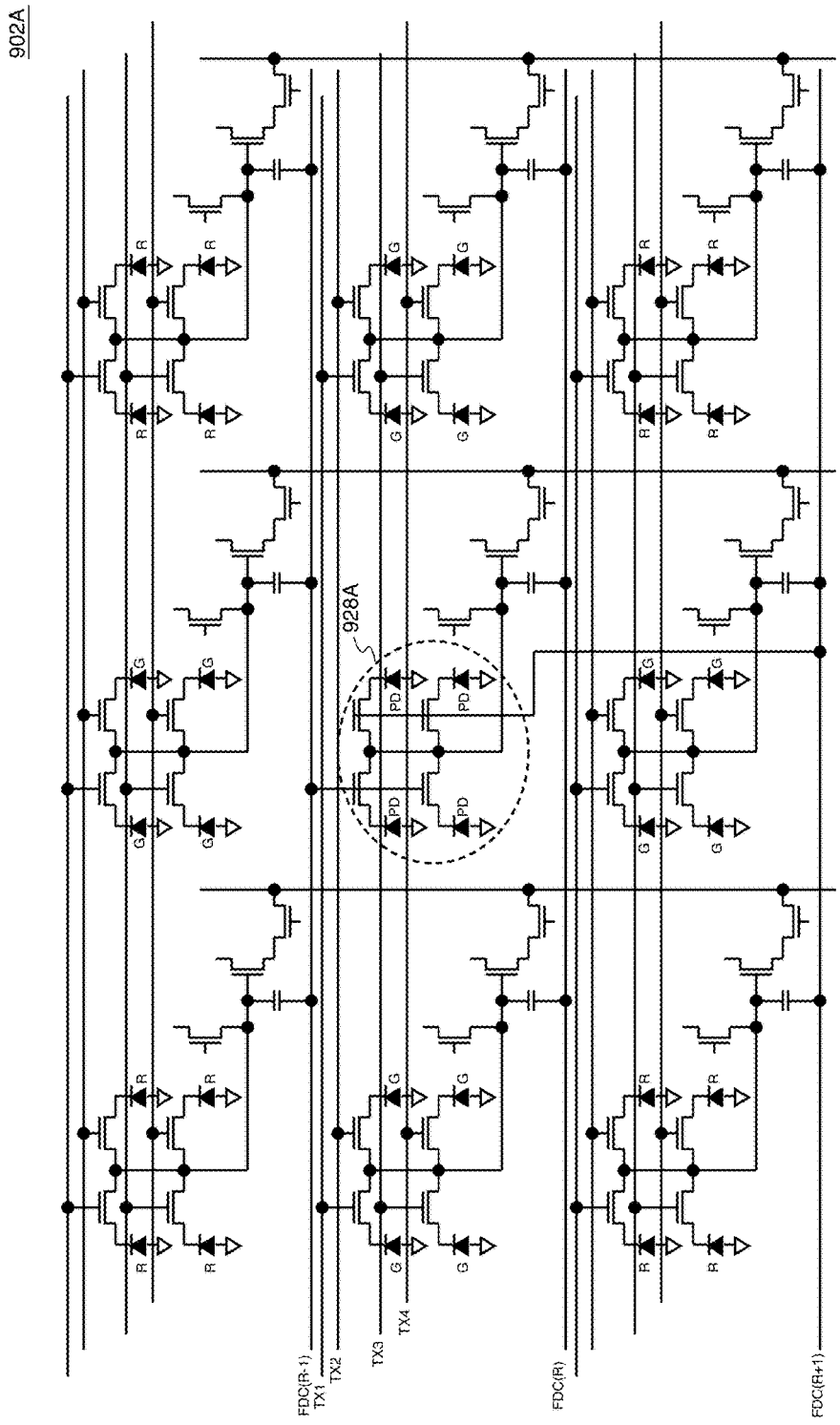
FIG. 9A illustrates another example of a schematic of a color pixel array including an array of photodiodes with phase detection autofocus photodiodes interspersed among binned image sensing photodiodes in accordance with the teachings of the present disclosure.

FIG. 9A illustrates yet another example of a schematic of a color pixel array 902A including an array of photodiodes with phase detection autofocus photodiodes interspersed among binned image sensing photodiodes in accordance with the teachings of the present disclosure. It is appreciated the pixel array 902A of FIG. 9A may be another example of pixel circuitry included in the of the pixel array 202 as shown in FIG. 2 or the pixel array 102 as shown in FIGS. 1A-1B, and that similarly named and numbered elements described above are coupled and function similarly below. It is further appreciated that pixel array 902A of FIG. 9A shares many similarities with pixel array 702 of FIG. 7, with pixel array 502 of FIG. 5, pixel array 302B of FIG. 3B and/or with pixel array 302A of FIG. 3A.

For instance, the portion of pixel array 902A depicted in FIG. 9A also shows 6 rows and 6 columns of photodiodes. It is appreciated that in other embodiments, the pixel array 902A may include a greater number of rows and columns. As shown in the depicted example, the photodiodes are arranged in 2×2 groupings. In the example, the left column of 2×2 groupings share a first bit line, the center column of 2×2 groupings share a second bit line, and the right column of 2×2 groupings share a third bit line.

In the depicted example, the upper left, the upper right, the lower left, and the lower right 2×2 groupings of photodiodes are configured to receive red light. The upper center, the center left, the center right, and the lower center 2×2 groupings of photodiodes are configured to receive green light. The center 2×2 grouping of photodiodes are configured as PDAF photodiodes. A microlens 928A over the PDAF photodiodes is illustrated with dashed lines in the illustrated example.

The depicted example shows that the center row of 2×2 groupings include transfer transistors that are coupled to be controlled in response to transfer control signals TX1, TX2, TX3, and TX4. It is noted that the upper row of 2×2 groupings include transfer transistors that are similarly coupled to be controlled in response to respective transfer control signals (not labeled) for the upper row 2×2 groupings, and that the bottom row of 2×2 groupings include transfer transistors that are similarly coupled to be controlled in response to respective transfer control signals (not labeled) for the bottom row of 2×2 groupings.

The example depicted in FIG. 9A also shows that the top row includes a first floating diffusion capacitor control signal FDC(R−1) coupled to provide a boost control signal to the capacitors coupled to the floating diffusions in the top row. The center row includes a second floating diffusion capacitor control signal FDC(R) coupled to provide a boost control signal to the capacitors coupled to the floating diffusions in the center row. The bottom row includes a third floating diffusion capacitor control signal FDC(R+1) coupled to provide a boost control signal to the capacitors coupled to the floating diffusions in the bottom row.

During operation, the floating diffusion control signal of the active row that is being read out is utilized to control the capacitors coupled to the floating diffusions of each pixel circuit of the active row of pixel array 902A that is being read out. The other floating diffusion control signals of the rows that are not being read out are therefore typically unused when the respective rows are inactive or idle.

However, referring to the example depicted in FIG. 9A, the otherwise unused floating diffusion control signals of neighboring inactive idle rows are instead coupled to control the transfer transistors coupled to the PDAF photodiodes of the active row being read out. For instance, assuming that the center row of pixel array 902A of FIG. 9A is an active row being read out, the center floating diffusion control signal FDC(R) is coupled to control the capacitors coupled to the floating diffusions of the pixel circuits in the active center row. The floating diffusion control signal FDC(R−1) of the inactive neighboring top row of FIG. 9A is coupled to control the transfer transistors coupled to the left pair of PDAF photodiodes of the center row under the microlens indicated with dashed line 928A. Similarly, the floating diffusion control signal FDC(R+1) of the inactive neighboring bottom row of FIG. 9A is coupled to control the transfer transistors coupled to the right pair of PDAF photodiodes of the center row under the microlens indicated with dashed line 928A.

Therefore, with pixel array 902A of FIG. 9A, the extra control wires used to control the transfer transistors coupled to the PDAF photodiodes are eliminated by reusing the existing floating diffusion capacitor control signals of neighboring idle rows in accordance with the teachings of the present invention.

Figure 9B:
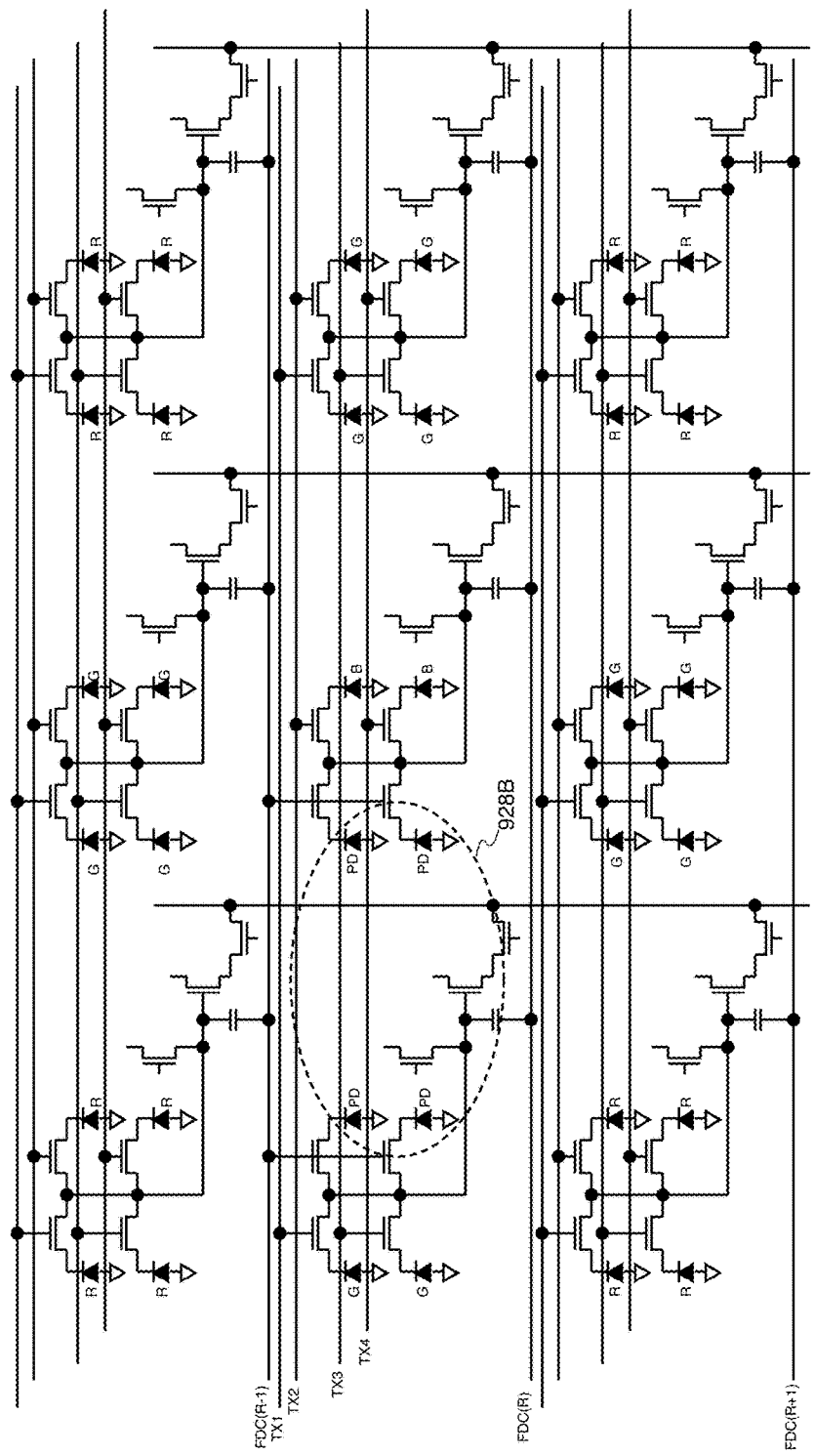
FIG. 9B illustrates yet another example of a schematic of a color pixel array including an array of photodiodes with phase detection autofocus photodiodes interspersed among binned image sensing photodiodes in accordance with the teachings of the present disclosure.

FIG. 9B illustrates yet another example of a schematic of a color pixel array 902B including an array of photodiodes with phase detection autofocus photodiodes in a pattern that is shifted by one and interspersed among binned image sensing photodiodes in accordance with the teachings of the present disclosure. It is appreciated the pixel array 902B of FIG. 9B may be another example of pixel circuitry included in the of the pixel array 602 as shown in FIG. 6 or the pixel array 802 as shown in FIG. 8, and that similarly named and numbered elements described above are coupled and function similarly below. It is further appreciated that pixel array 902B of FIG. 9B shares many similarities with pixel array 902A of FIG. 9A, pixel array 702 of FIG. 7, pixel array 502 of FIG. 5, pixel array 302B of FIG. 3B and/or with pixel array 302A of FIG. 3A.

For instance, the portion of pixel array 902B depicted in FIG. 9B also shows 6 rows and 6 columns of photodiodes. It is appreciated that in other embodiments, the pixel array 902B may include a greater number of rows and columns. As shown in the depicted example, the photodiodes are arranged in 2×2 groupings. In the example, the left column of 2×2 groupings share a first bit line, the center column of 2×2 groupings share a second bit line, and the right column of 2×2 groupings share a third bit line.

The depicted example shows that the center row of 2×2 groupings include transfer transistors that are coupled to be controlled in response to transfer control signals TX1, TX2, TX3, and TX4. It is noted that the upper row of 2×2 groupings include transfer transistors that are similarly coupled to be controlled in response to respective transfer control signals (not labeled) for the upper row 2×2 groupings, and that the bottom row of 2×2 groupings include transfer transistors that are similarly coupled to be controlled in response to respective transfer control signals (not labeled) for the bottom row of 2×2 groupings.

In the depicted example, the upper left, the upper right, the lower left, and the lower right 2×2 groupings of photodiodes are configured to receive red light. The upper center, the right center, and the lower center 2×2 groupings of photodiodes are configured to receive green light. With the shifted PDAF pixel scheme of pixel array 902B depicted in FIG. 9B, the left pair of the 2×2 groupings of photodiodes in the left center 2×2 grouping of photodiodes is configured to receive green light, and the right pair of the 2×2 grouping of photodiodes in the center 2×2 grouping is configured to receive blue light. In addition, with the shifted PDAF pixel scheme of pixel array 902B depicted in FIG. 9B, the right pair of the 2×2 grouping of photodiodes in the left center 2×2 grouping of photodiodes and the left pair of the 2×2 grouping of photodiodes in the center 2×2 grouping of photodiodes, which are indicated with the dashed line 928B representing the PDAF microlens, are configured as PDAF photodiodes.

The example depicted in FIG. 9B also shows that the top row includes a first floating diffusion capacitor control signal FDC(R−1) coupled to provide a boost control signal to the capacitors coupled to the floating diffusions in the top row. The center row includes a second floating diffusion capacitor control signal FDC(R) coupled to provide a boost control signal to the capacitors coupled to the floating diffusions in the center row. The bottom row includes a third floating diffusion capacitor control signal FDC(R+1) coupled to provide a boost control signal to the capacitors coupled to the floating diffusions in the bottom row.

During operation, the floating diffusion control signal of the active row that is being read out is utilized to control the capacitors coupled to the floating diffusions of each pixel circuit of the active row of pixel array 902B that is being read out. The other floating diffusion control signals of the rows that are not being read out are therefore typically unused when the rows are inactive.

However, referring to the example depicted in FIG. 9B, the otherwise unused floating diffusion control signal of neighboring inactive idle row above is instead coupled to control the transfer transistors coupled to the PDAF photodiodes of the active row being read out. For instance, assume that the center row of pixel array 902B of FIG. 9B is an active row being read out. As such, the center floating diffusion control signal FDC(R) is coupled to control the capacitors coupled to the floating diffusions of the pixel circuits in the active center row. The floating diffusion control signal FDC(R−1) of the inactive neighboring top row of FIG. 9B is coupled to control the transfer transistors coupled to the 2×2 grouping of PDAF photodiodes of the center row under the microlens indicated with dashed line 928B. It is noted that the floating diffusion control signal FDC(R+1) of the inactive neighboring bottom row of FIG. 9B remains unused during the readout of the active center row of pixel array 902B of FIG. 9B.

Therefore, with pixel array 902B of FIG. 9B, the extra control wires used to control the transfer transistors coupled to the PDAF photodiodes are eliminated by reusing the existing floating diffusion capacitor control signal of idle row neighboring the active row being read out in accordance with the teachings of the present invention.

Figure 9C:
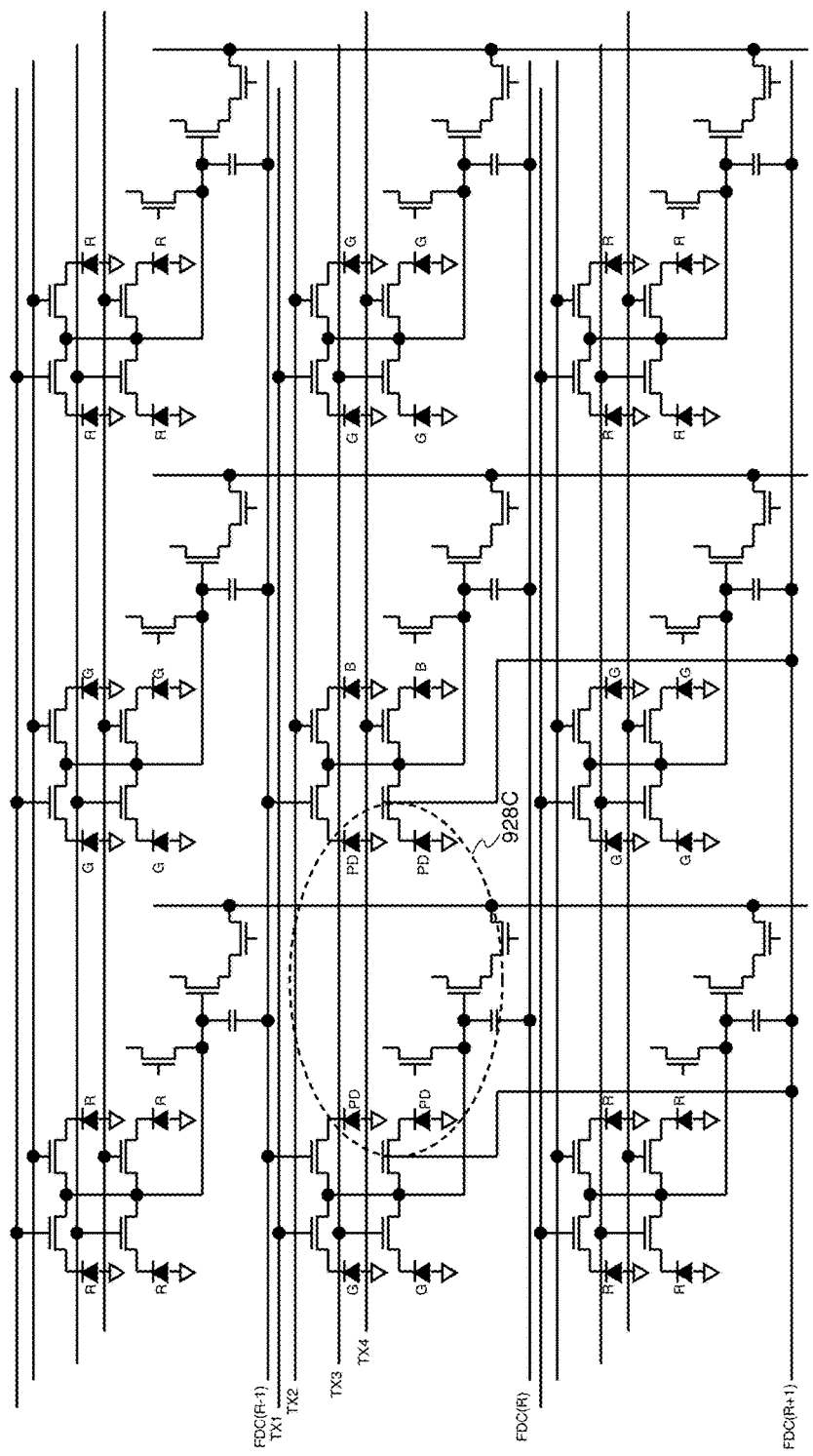
FIG. 9C illustrates still another example of a schematic of a color pixel array including an array of photodiodes with phase detection autofocus photodiodes interspersed among binned image sensing photodiodes in accordance with the teachings of the present disclosure.

FIG. 9C illustrates still another example of a schematic of a color pixel array 902C including an array of photodiodes with phase detection autofocus photodiodes in a pattern that is shifted by one and interspersed among binned image sensing photodiodes in accordance with the teachings of the present disclosure. It is appreciated the pixel array 902C of FIG. 9C may be another example of pixel circuitry included in the of the pixel array 602 as shown in FIG. 6 or the pixel array 802 as shown in FIG. 8, and that similarly named and numbered elements described above are coupled and function similarly below. It is further appreciated that pixel array 902C of FIG. 9C shares many similarities with pixel array 902B of FIG. 9B, pixel array 902A of FIG. 9A, pixel array 702 of FIG. 7, pixel array 502 of FIG. 5, pixel array 302B of FIG. 3B and/or with pixel array 302A of FIG. 3A.

For instance, the portion of pixel array 902C depicted in FIG. 9C also shows 6 rows and 6 columns of photodiodes. It is appreciated that in other embodiments, the pixel array 902C may include a greater number of rows and columns. As shown in the depicted example, the photodiodes are arranged in 2×2 groupings. In the example, the left column of 2×2 groupings share a first bit line, the center column of 2×2 groupings share a second bit line, and the right column of 2×2 groupings share a third bit line.

The depicted example shows that the center row of 2×2 groupings include transfer transistors that are coupled to be controlled in response to transfer control signals TX1, TX2, TX3, and TX4. It is noted that the upper row of 2×2 groupings include transfer transistors that are similarly coupled to be controlled in response to respective transfer control signals (not labeled) for the upper row 2×2 groupings, and that the bottom row of 2×2 groupings include transfer transistors that are similarly coupled to be controlled in response to respective transfer control signals (not labeled) for the bottom row of 2×2 groupings.

In the depicted example, the upper left, the upper right, the lower left, and the lower right 2×2 groupings of photodiodes are configured to receive red light. The upper center, the right center, and the lower center 2×2 groupings of photodiodes are configured to receive green light. With the shifted PDAF pixel scheme of pixel array 902C depicted in FIG. 9C, the left pair of the 2×2 groupings of photodiodes in the left center 2×2 grouping of photodiodes is configured to receive green light, and the right pair of the 2×2 grouping of photodiodes in the center 2×2 grouping is configured to receive blue light. In addition, with the shifted PDAF pixel scheme of pixel array 902C depicted in FIG. 9C, the right pair of the 2×2 grouping of photodiodes in the left center 2×2 grouping of photodiodes and the left pair of the 2×2 grouping of photodiodes in the center 2×2 grouping of photodiodes, which are indicated with the dashed line 928C representing the PDAF microlens, are configured as PDAF photodiodes.

The example depicted in FIG. 9C also shows that the top row includes a first floating diffusion capacitor control signal FDC(R−1) coupled to provide a boost control signal to the capacitors coupled to the floating diffusions in the top row. The center row includes a second floating diffusion capacitor control signal FDC(R) coupled to provide a boost control signal to the capacitors coupled to the floating diffusions in the center row. The bottom row includes a third floating diffusion capacitor control signal FDC(R+1) coupled to provide a boost control signal to the capacitors coupled to the floating diffusions in the bottom row.

During operation, the floating diffusion control signal of the active row that is being read out is utilized to control the capacitors coupled to the floating diffusions of each pixel circuit of the active row of pixel array 902C that is being read out. The other floating diffusion control signals of the rows that are not being read out are therefore typically unused when the rows are inactive.

However, referring to the example depicted in FIG. 9C, the otherwise unused floating diffusion control signals of neighboring inactive idle rows are instead coupled to control the transfer transistors coupled to the PDAF photodiodes of the active row being read out. For instance, assume that the center row of pixel array 902C of FIG. 9C is an active row being read out. As such, the center floating diffusion control signal FDC(R) is coupled to control the capacitors coupled to the floating diffusions of the pixel circuits in the active center row. The floating diffusion control signal FDC(R−1) of the inactive neighboring top row of FIG. 9C is coupled to control the transfer transistors coupled to the top pair of PDAF photodiodes of the center row under the microlens indicated with dashed line 928C. Similarly, the floating diffusion control signal FDC(R+1) of the inactive neighboring bottom row of FIG. 9C is coupled to control the transfer transistors coupled to the bottom pair of PDAF photodiodes of the center row under the microlens indicated with dashed line 928C.

Therefore, with pixel array 902C of FIG. 9C, the extra control wires used to control the transfer transistors coupled to the PDAF photodiodes are eliminated by reusing the existing floating diffusion capacitor control signals of neighboring idle rows in accordance with the teachings of the present invention.

Figure 10:
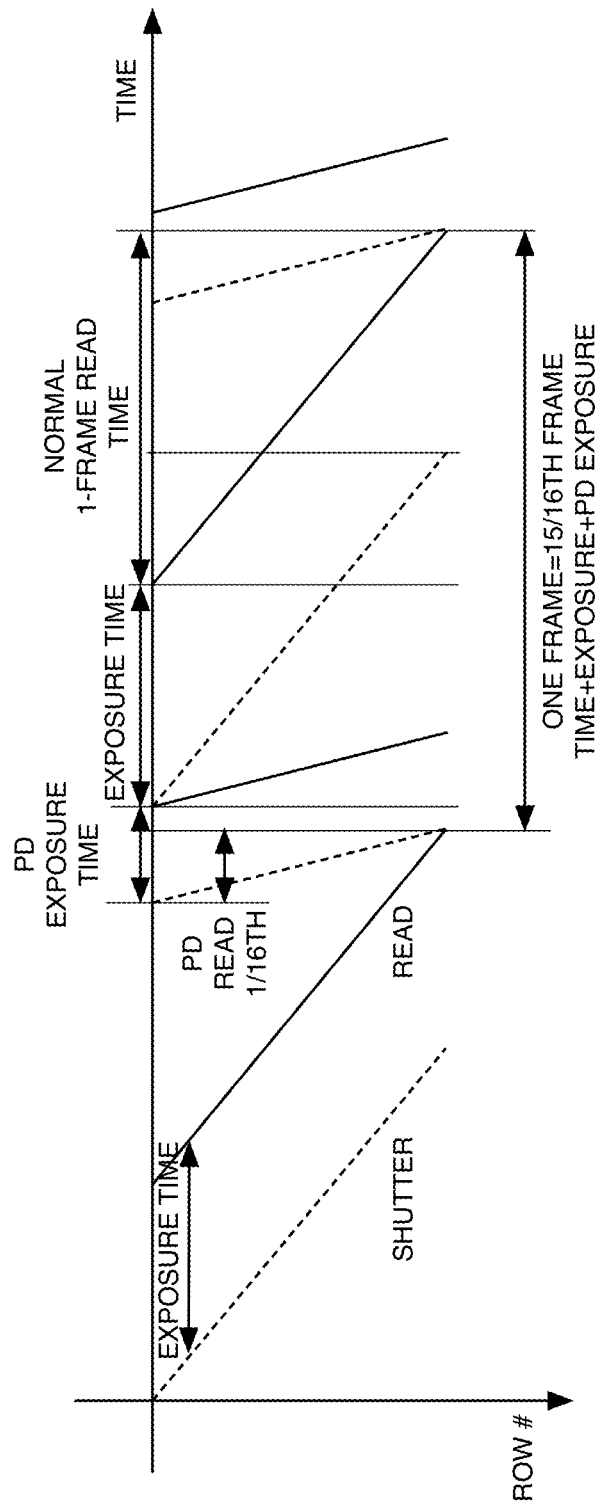
FIG. 10 is another example timing diagram that illustrates the exposure time and read out time of a color pixel array with an array of photodiodes including phase detection autofocus photodiodes interspersed among binned image sensing photodiodes in accordance with the teachings of the present disclosure.

FIG. 10 is another example timing diagram that illustrates the exposure time and read out time of a color pixel array with an array of photodiodes including phase detection autofocus photodiodes interspersed among binned image sensing photodiodes in accordance with the teachings of the present disclosure. In particular, FIG. 10 illustrates PD mini-frame timing utilizing neighboring floating diffusion control signal (e.g., FDC(n)) wires. Referring back to the example schematics illustrated above in FIGS. 9A-9C, by utilizing one or more neighboring inactive idle rows' floating diffusion control signals (e.g., FDC(n)), additional phase detection transfer control signal wires (e.g., TXPD) are no longer needed. However, it is appreciated that the utilization of neighboring inactive idle rows' floating diffusion control signals may present some limitations on the PDAF photodiodes' exposure control. For instance, the timing diagram shown in FIG. 10 illustrates two of the requirements for the PD mini-frame timing. First, the PDAF reset operation must occur after a normal pixel readout. Otherwise during a normal pixel readout, the toggling of the floating diffusion capacitor control signal (e.g., FDC) to boost the floating diffusion would destroy the exposure information of PDAF pixels. Furthermore, the PDAF photodiode read out must occur before a normal pixel reset. Otherwise during the normal pixel reset, the toggling of the boost line would also destroy the exposure information of PDAF pixels.

It is also appreciated that frame rate may be decreased, depending on the sum of normal pixel exposure time and PDAF pixel exposure time. In an example pixel reset scheme, the floating diffusion control signal (e.g., FDC) boost line may be utilized during reset to improve image lag. If image lag is not a concern, the toggling of floating diffusion control signal may be avoided during the pixel reset, which helps to remove the requirement of reading out the PDAF pixels before the normal pixel reset. In a normal 4C readout, as transfer transistors coupled to all four pixels of the 2×2 grouping are all switched on at the same time for charge transfer, the floating diffusion capacitor control signal is usually disabled to avoid boosting the floating diffusion voltage too high. In such an example, the requirement to perform the PDAF reset operation after the normal pixel read out is removed.

Figure 11:
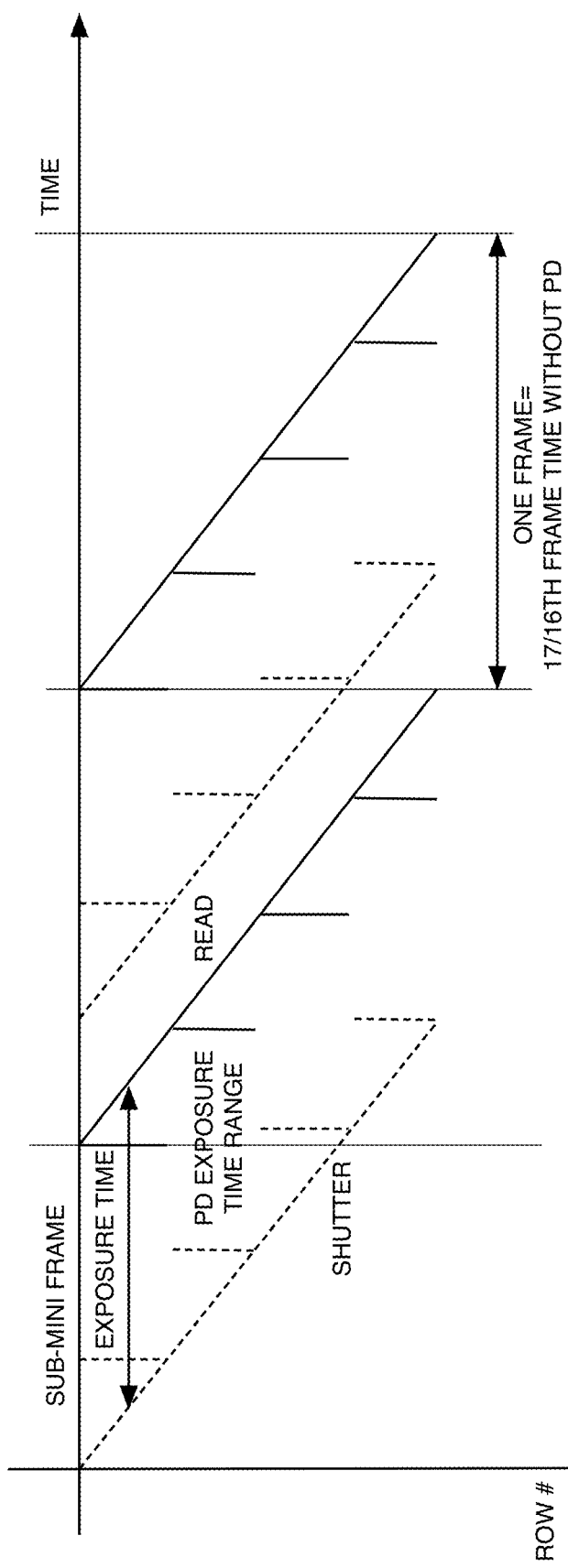
FIG. 11 is yet another example timing diagram that illustrates the exposure time and read out time of a color pixel array with an array of photodiodes including phase detection autofocus photodiodes interspersed among binned image sensing photodiodes in accordance with the teachings of the present disclosure.

FIG. 11 is yet another example timing diagram that illustrates the exposure time and read out time of a color pixel array with an array of photodiodes including phase detection autofocus photodiodes interspersed among binned image sensing photodiodes in accordance with the teachings of the present disclosure. In particular, FIG. 11 illustrates example interleaved PDAF timing utilizing neighboring floating diffusion control signal (e.g., FDC(n)) wires. In an interleaved PDAF photodiode read out example, the limitation on frame rate is relaxed as shown in FIG. 11. As shown, only the PDAF reset, exposure, and read out are required to be within the normal pixel exposure time. One frame time is the same as it is with the extra TXPD control wires.

Figure 12:
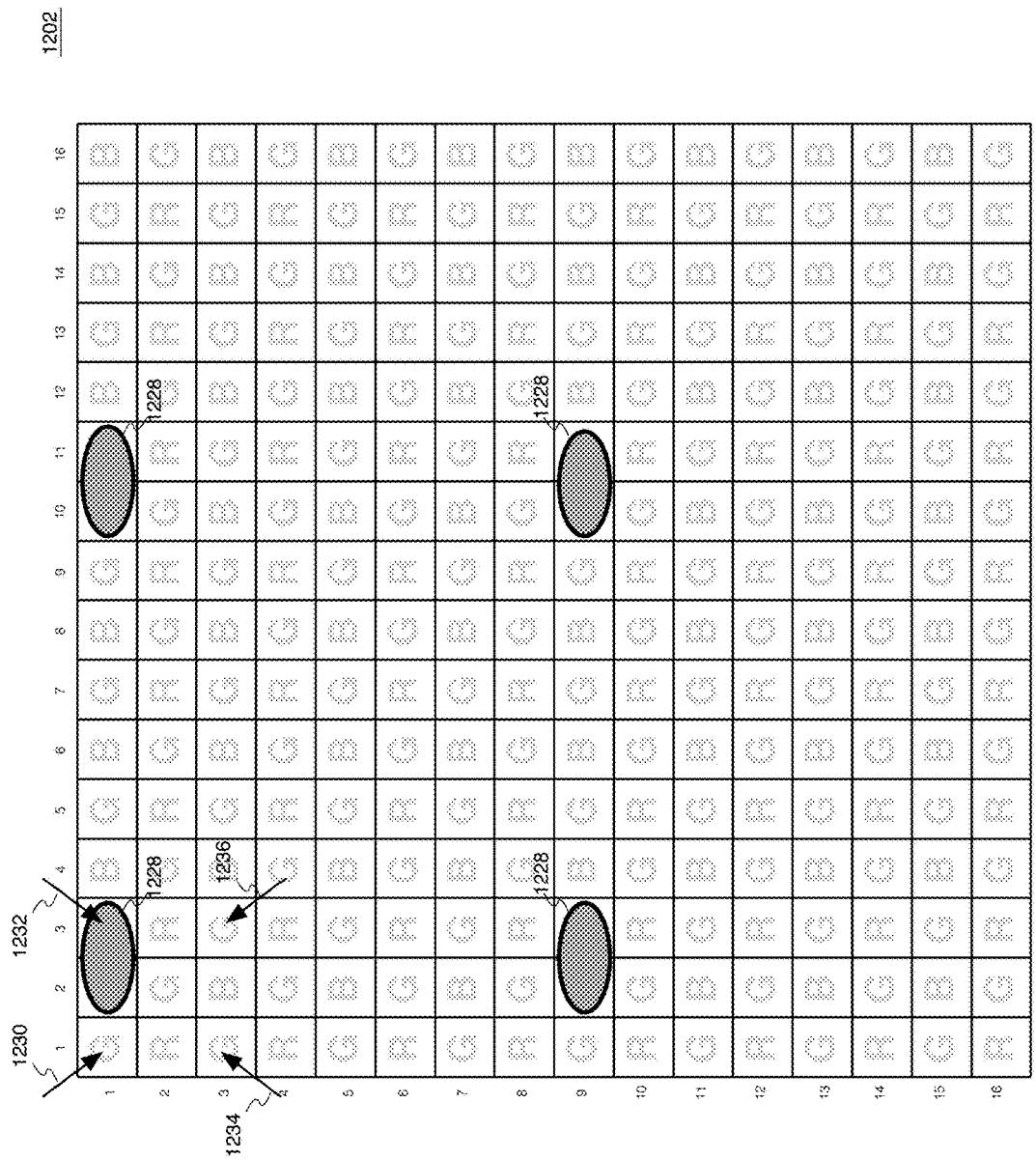
FIG. 12 illustrates still another example of a color pixel array with an array of photodiodes including phase detection autofocus photodiodes interspersed among binned image sensing photodiodes in accordance with the teachings of the present disclosure.

FIG. 12 illustrates still another example of a color pixel array 1202 with an array of photodiodes including a 2×1 groupings phase detection autofocus photodiodes interspersed among binned image sensing photodiodes in accordance with the teachings of the present disclosure. In particular, FIG. 12 illustrates color pixel array 1202 having a 2×1 PDAF pattern interspersed in a Bayer pattern color filter in 1C mode. For instance, FIG. 12 shows microlenses 1228 covering a 2×1 groupings of neighboring PDAF photodiodes interspersed among normal image sensing photodiodes in pixel array 1202. In 1C mode, each color filter of the Bayer pattern covers a single photodiode (i.e., a 1×1 grouping for each color channel).

In a 2×2 binning mode, four nearby photodiodes of same color channel are binned together as illustrated for example with the arrows 1230, 1232, 1234, and 1236 in FIG. 12. As can be appreciated from the illustrated example, the PDAF information is destroyed as the arrow 1232 pointing to a PDAF photodiode is binned with the three other green photodiodes, as indicated by arrows 1230, 1234, and 1236, which don't provide PDAF information. Consequently, for a Bayer pattern color filter with interspersed 2×1 micro lens phase detection (MLPD), phase detection autofocus cannot be supported in a 2×2 binning mode if the PDAF photodiodes (e.g., as indicated with arrow 1232) are read out at along with the normal image sensing photodiodes (e.g., as indicated with arrows 1230, 1234, and 1236).

However, it is appreciated that with individual TXPD controls for PDAF pixels as discussed in detail in the various examples above, the PDAF photodiodes can be read out separately or at a different times from normal image sensing photodiodes, even in 2×2 binning mode. In 2×2 binning mode, the photodiode indicated with arrow 1230 and the photodiode indicated with arrow 1234 are binned together, and the photodiode indicated with arrow 1232 and the photodiode indicated with arrow 1236 are binned together. Later they are summed or averaged by analog or digital circuits. In the case of a PDAF photodiode, such as the photodiode indicated with arrow 1232, the binned data the photodiode indicated with arrow 1232 and the photodiode indicated with arrow 1236 is discarded, and the TXPD control signal coupled to the photodiode indicated with arrow 1232 is not enabled for a normal binning readout. Later the photodiode indicated with arrow 1232 is read out separately in the PD mini-frame time with the TXPD control signal enabled as described in the examples above in accordance with the teachings of the present invention.

For a 16×16 Bayer color filter pattern example as depicted in FIG. 12, the pattern of 16 timing rows can be read out with two half row column ADC circuits. The total time to read out the PD mini-frame is two timing rows as it requires two read outs for left and right PDAF photodiodes. Similar as with a 4C color filter, the timing for a PD mini-frame with shifted PD patterns can be reduced in accordance with the teachings of the present invention. Table 1 below is a summary of the timing required for PD mini-frame, with different PDAF patterns.

TABLE 1

PD mini-frame timing for different configurations.

| # of FD per PD. (shifted PDAF by 1 pixel | PD pixel column shift for more parallelism | Color filter pattern | Image frame timing reference | 2 bit line per 2 × 2 shared pixel PD mini-frame timing (α) |
|---|---|---|---|---|
| 2 (shifted) | default shifted | 2 × 2 MLPD for 4C | 1 | ⅛ ¹⁄₁₆ |
| 1 (default) | Default shifted | | | ¼ ⅛ |
| 2 (shifted) | default shifted | 2 × 1 MLPD for Bayer pattern | | ¼ ⅛ |
| 1 (default) | Default shifted | | | ½ ¼ |

Figure 13:
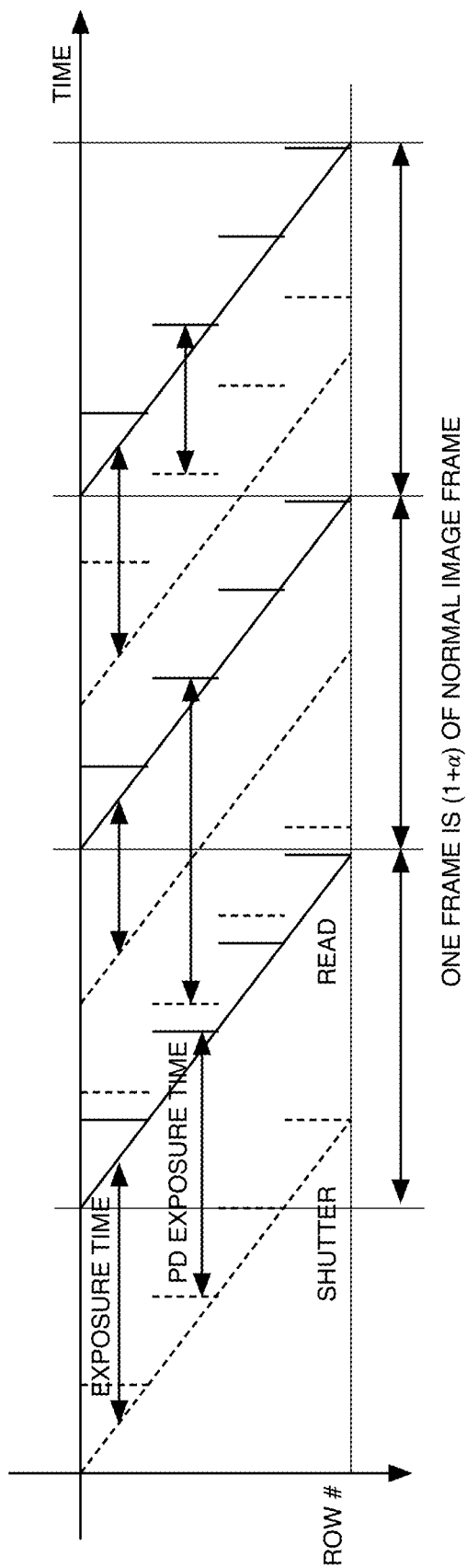
FIG. 13 is still another example timing diagram that illustrates the exposure time and read out time of a color pixel array with an array of photodiodes including phase detection autofocus photodiodes interspersed among binned image sensing photodiodes in accordance with the teachings of the present disclosure.

FIG. 13 is another example timing diagram that illustrates the exposure times and read out times of a color pixel array with an array of photodiodes including phase detection autofocus photodiodes interspersed among binned image sensing photodiodes in accordance with the teachings of the present disclosure. Instead of having a PD mini-frame, the timing diagram example of FIG. 13 shows that the PDAF row read outs can be interleaved with the normal image sensing row read outs, as shown in the timing diagram of FIG. 13. It is noted that the bars on the right side of the timing diagram in FIG. 13 indicate where PDAF photodiodes are reset and read out. The PDAF photodiodes can have the same (e.g., as shown with the bars on the left side of the timing diagram), longer (e.g., as shown with the bars in the middle of the timing diagram), or shorter (e.g., as shown with the bars on the right side of the timing diagram) exposure times compared with normal photodiode exposure times. Compared with a PD mini-frame, PDAF photodiodes are read out relatively close in time to normal photodiodes, and the PDAF information included in the read outs can reflect the normal photodiodes more closely in the time domain.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An imaging device, comprising:
a plurality of photodiodes arranged into rows and columns of a photodiode array, wherein the plurality of photodiodes includes:
a first set of photodiodes configured as image sensing photodiodes; and
a second set of photodiodes configured as phase detection auto focus (PDAF) photodiodes, wherein the PDAF photodiodes are arranged in at least pairs in neighboring columns of the photodiode array, wherein the pairs of PDAF photodiodes are interspersed among the image sensing photodiodes throughout the rows and throughout the columns of the photodiode array;
a plurality of transfer transistors, wherein each one of the transfer transistors is coupled to a corresponding one of the plurality photodiodes,
wherein the transfer transistors that are coupled to the image sensing photodiodes included in an active row of the photodiode array are coupled to be controlled in response to a first transfer control signal or a second transfer control signal that are coupled to control all of the image sensing photodiodes included in the active row, and
wherein one of the transfer transistors that is coupled to one of a pair of the PDAF photodiodes that is included in the active row of the photodiode array is a first transfer transistor, wherein the first transfer transistor is coupled to be controlled in response to a first PDAF control signal that is independent of the first or second transfer control signals.

2. The imaging device of claim 1, wherein an other one of the transfer transistors that is coupled to said one of the pair of the PDAF photodiodes that is included in the active row of the photodiode array is a second transfer transistor, wherein the second transfer transistor is coupled to be controlled in response to the first PDAF control signal that is independent of the first or second transfer control signals.

3. The imaging device of claim 1, wherein an other one of the transfer transistors that is coupled to said one of the pair of the PDAF photodiodes that is included in the active row of the photodiode array is a second transfer transistor, wherein the second transfer transistor is coupled to be controlled in response to a second PDAF control signal that is independent of the first PDAF control signal and independent of the first or second transfer control signals.

4. The imaging device of claim 1, wherein an other one of the transfer transistors that is coupled to said one of the pair of the PDAF photodiodes that is included in the active row of the photodiode array is a second transfer transistor, wherein the second transfer transistor is coupled to be controlled in response to the first transfer control signal.

5. The imaging device of claim 4, wherein the first transfer transistor is further coupled to a first floating diffusion, wherein the second transfer transistor is further coupled to a second floating diffusion, wherein the first floating diffusion is different from the second floating diffusion.

6. The imaging device of claim 1, wherein the PDAF photodiodes that are arranged in pairs in neighboring columns of the photodiode array are further arranged in 2×2 groupings in the neighboring columns and neighboring rows of the photodiode array, wherein the 2×2 groupings of PDAF photodiodes are interspersed among the image sensing photodiodes throughout the rows and throughout the columns of the photodiode array,
wherein the first transfer transistor that is coupled to said one of the pair of the PDAF photodiodes is coupled to a first 2×2 grouping of PDAF photodiodes that includes said one of the pair of the PDAF photodiodes, and
wherein said one of the pair of the PDAF photodiodes is a first PDAF photodiode of the first 2×2 grouping of PDAF photodiodes.

7. The imaging device of claim 6, wherein an other one of the transfer transistors that is coupled to a second PDAF photodiode that is included in the active row of the photodiode array is a second transfer transistor coupled to the first 2×2 grouping of PDAF photodiodes.

8. The imaging device of claim 7, wherein the second transfer transistor is coupled to be controlled in response to the first PDAF control signal that is independent of the first or second transfer control signals.

9. The imaging device of claim 8, wherein the a third PDAF photodiode of the first 2×2 grouping of PDAF photodiodes is coupled to a third transfer transistor, wherein the first PDAF photodiode and the third PDAF photodiode are in a first column,
wherein a fourth PDAF photodiode of the first 2×2 grouping of PDAF photodiodes coupled to a fourth transfer transistor, wherein the second PDAF photodiode and the fourth PDAF photodiode are in a second column, wherein the first column and second column are neighboring columns, and
wherein the third transfer transistor and the fourth transfer transistor are coupled to be controlled in response to a second PDAF control signal that is independent of the first PDAF control signal and independent of the first or second transfer control signals.

10. The imaging device of claim 9, wherein the first PDAF control signal is further coupled to control a first floating diffusion capacitor of a first neighboring non-active row of the photodiode array, and
wherein the second PDAF control signal is further coupled to control a second floating diffusion capacitor of a second neighboring non-active row of the photodiode array.

11. The imaging device of claim 8, wherein the a third PDAF photodiode of the first 2×2 grouping of PDAF photodiodes is coupled to a third transfer transistor, wherein the first PDAF photodiode and the third PDAF photodiode are in a first column,
wherein a fourth PDAF photodiode of the first 2×2 grouping of PDAF photodiodes coupled to a fourth transfer transistor, wherein the second PDAF photodiode and the fourth PDAF photodiode are in a second column, wherein the first column and second column are neighboring columns, and
wherein the third transfer transistor and the fourth transfer transistor are coupled to be controlled in response to the first PDAF control signal that is independent of the first or second transfer control signals.

12. The imaging device of claim 11, wherein the first PDAF control signal is further coupled to control a first floating diffusion capacitor of a first neighboring non-active row of the photodiode array, and
wherein the second PDAF control signal is further coupled to control a second floating diffusion capacitor of a second neighboring non-active row of the photodiode array.

13. The imaging device of claim 11, wherein the first transfer transistor, and the third transfer transistor are coupled to a first floating diffusion, and wherein the second transfer transistor, and the fourth transfer transistor are coupled to a second floating diffusion.

14. The imaging device of claim 9, wherein the first transfer transistor, the third transfer transistor, the second transfer transistor, and the fourth transfer transistor are coupled to a first floating diffusion.

15. The imaging device of claim 9, wherein the first transfer transistor, and the third transfer transistor are coupled to a first floating diffusion, and
    wherein the second transfer transistor, and the fourth transfer transistor are coupled to a second floating diffusion.

16. The imaging device of claim 7, wherein the second transfer transistor is coupled to be controlled in response to a second PDAF control signal that is independent of the first PDAF control signal and independent of the first or second transfer control signals.

17. The imaging device of claim 16, wherein the a third PDAF photodiode of the first 2×2 grouping of PDAF photodiodes is coupled to a third transfer transistor, wherein the first PDAF photodiode and the third PDAF photodiode are in a first column,
    wherein a fourth PDAF photodiode of the first 2×2 grouping of PDAF photodiodes coupled to a fourth transfer transistor, wherein the second PDAF photodiode and the fourth PDAF photodiode are in a second column, wherein the first column and second column are neighboring columns,
    wherein the third transfer transistor is coupled to be controlled in response to the first PDAF control signal, and
    wherein the fourth transfer transistor is coupled to be controlled in response to the second PDAF control signal.

18. The imaging device of claim 17, wherein the first PDAF control signal is further coupled to control a first floating diffusion capacitor of a first neighboring non-active row of the photodiode array, and
    wherein the second PDAF control signal is further coupled to control a second floating diffusion capacitor of a second neighboring non-active row of the photodiode array.

19. The imaging device of claim 1, wherein exposure times of the second set of photodiodes are different than exposure times of the first set of photodiodes.

20. The imaging device of claim 1, wherein readouts of the second set of photodiodes are configured to be performed separately from readouts of the first set of photodiodes.

21. The imaging device of claim 20, wherein readouts of the second set of photodiodes are configured to be performed after readouts of the first set of photodiodes in the active row of the photodiode array.

22. The imaging device of claim 20, wherein readouts of the second set of photodiodes are configured to be interleaved with readouts of the first set of photodiodes in the active row of the photodiode array.

23. The imaging device of claim 1, further comprising a color filter array disposed over the photodiode array, wherein the color filter array includes a plurality of color filters arranged in a Bayer pattern over the plurality of photodiodes.

24. The imaging device of claim 23, wherein the plurality of photodiodes are arranged in 2×2 binned groupings, wherein each photodiode of each 2×2 binned grouping included in the first set of photodiodes is configured to be illuminated with incident light through respective color filters of the plurality of color filters having a same color.

25. An imaging system, comprising:
    a pixel array including plurality of photodiodes arranged into rows and columns, wherein the plurality of photodiodes includes:
        photodiodes configured as image sensing photodiodes; and
        photodiodes configured as phase detection auto focus (PDAF) photodiodes, wherein the PDAF photodiodes are arranged in at least pairs in neighboring columns of the pixel array, wherein the pairs of PDAF photodiodes are interspersed among the image sensing photodiodes throughout the rows and throughout the columns of the pixel array;
    a plurality of transfer transistors, wherein each one of the transfer transistors is coupled to a corresponding one of the plurality photodiodes,
        wherein the transfer transistors that are coupled to the image sensing photodiodes included in an active row of the pixel array are coupled to be controlled in response to a first transfer control signal or a second transfer control signal that are coupled to control all of the image sensing photodiodes included in the active row, and
        wherein one of the transfer transistors that is coupled to one of a pair of the PDAF photodiodes that is included in the active row of the pixel array is a first transfer transistor, wherein the first transfer transistor is coupled to be controlled in response to a first PDAF control signal that is independent of the first or second transfer control signals;
    a control circuitry coupled to the pixel array to control operation of the pixel array; and
    a readout circuitry coupled to the pixel array to read out image data from the pixel array.

26. The imaging system of claim 25, further comprising function logic coupled to the readout circuitry to store the image data read out from the pixel array.

27. The imaging system of claim 25, wherein the readout circuitry is coupled to read out the image data from the pixel array through a plurality of bit lines.

28. The imaging system of claim 27, further comprising:
    a plurality of row select transistors, wherein each row select transistor is coupled to one of the plurality of bit lines;
    a plurality of source follower transistors, wherein each source follower transistor is coupled to one of the row select transistors;
    a plurality of floating diffusions, wherein each floating diffusion is coupled to a gate terminal of one of the source follower transistors, wherein each floating diffusion is further coupled to one or more of the transfer transistors;
    a plurality of reset transistors, wherein each reset transistor is coupled to one of the row floating diffusions; and
    a plurality of reset transistors, wherein each reset transistor is coupled to one of the floating diffusions.

29. The imaging system of claim 28, further comprising a plurality of floating diffusion capacitors, wherein each floating diffusion capacitor is coupled to one of the floating diffusions.

30. The imaging system of claim 25, wherein an other one of the transfer transistors that is coupled to said one of the pair of the PDAF photodiodes that is included in the active row of the photodiode array is a second transfer transistor, wherein the second transfer transistor is coupled to be controlled in response to the first PDAF control signal that is independent of the first or second transfer control signals.

31. The imaging system of claim 25, wherein an other one of the transfer transistors that is coupled to said one of the pair of the PDAF photodiodes that is included in the active row of the photodiode array is a second transfer transistor, wherein the second transfer transistor is coupled to be controlled in response to a second PDAF control signal that is independent of the first PDAF control signal and independent of the first or second transfer control signals.

32. The imaging system of claim 25, wherein an other one of the transfer transistors that is coupled to said one of the pair of the PDAF photodiodes that is included in the active row of the photodiode array is a second transfer transistor, wherein the second transfer transistor is coupled to be controlled in response to the first transfer control signal.

33. The imaging system of claim 32, wherein the first transfer transistor is further coupled to a first floating diffusion, wherein the second transfer transistor is further coupled to a second floating diffusion, wherein the first floating diffusion is different from the second floating diffusion.

34. The imaging system of claim 25, wherein the PDAF photodiodes that are arranged in pairs in neighboring columns of the photodiode array are further arranged in 2×2 groupings in the neighboring columns and neighboring rows of the photodiode array, wherein the 2×2 groupings of PDAF photodiodes are interspersed among the image sensing photodiodes throughout the rows and throughout the columns of the photodiode array,
  wherein the first transfer transistor that is coupled to said one of the pair of the PDAF photodiodes is coupled to a first 2×2 grouping of PDAF photodiodes that includes said one of the pair of the PDAF photodiodes, and
  wherein said one of the pair of the PDAF photodiodes is a first PDAF photodiode of the first 2×2 grouping of PDAF photodiodes.

35. The imaging system of claim 34, wherein an other one of the transfer transistors that is coupled to a second PDAF photodiode that is included in the active row of the photodiode array is a second transfer transistor coupled to the first 2×2 grouping of PDAF photodiodes.

36. The imaging system of claim 35, wherein the second transfer transistor is coupled to be controlled in response to the first PDAF control signal that is independent of the first or second transfer control signals.

37. The imaging system of claim 36, wherein the a third PDAF photodiode of the first 2×2 grouping of PDAF photodiodes is coupled to a third transfer transistor, wherein the first PDAF photodiode and the third PDAF photodiode are in a first column,
  wherein a fourth PDAF photodiode of the first 2×2 grouping of PDAF photodiodes coupled to a fourth transfer transistor, wherein the second PDAF photodiode and the fourth PDAF photodiode are in a second column, wherein the first column and second column are neighboring columns, and
  wherein the third transfer transistor and the fourth transfer transistor are coupled to be controlled in response to a second PDAF control signal that is independent of the first PDAF control signal and independent of the first or second transfer control signals.

38. The imaging system of claim 37, wherein the first PDAF control signal is further coupled to control a first floating diffusion capacitor of a first neighboring non-active row of the photodiode array, and
  wherein the second PDAF control signal is further coupled to control a second floating diffusion capacitor of a second neighboring non-active row of the photodiode array.

39. The imaging system of claim 37, wherein the first transfer transistor, the third transfer transistor, the second transfer transistor, and the fourth transfer transistor are coupled to a first floating diffusion.

40. The imaging system of claim 37, wherein the first transfer transistor, and the third transfer transistor are coupled to a first floating diffusion, and
  wherein the second transfer transistor, and the fourth transfer transistor are coupled to a second floating diffusion.

41. The imaging system of claim 36, wherein the a third PDAF photodiode of the first 2×2 grouping of PDAF photodiodes is coupled to a third transfer transistor, wherein the first PDAF photodiode and the third PDAF photodiode are in a first column,
  wherein a fourth PDAF photodiode of the first 2×2 grouping of PDAF photodiodes coupled to a fourth transfer transistor, wherein the second PDAF photodiode and the fourth PDAF photodiode are in a second column, wherein the first column and second column are neighboring columns, and
  wherein the third transfer transistor and the fourth transfer transistor are coupled to be controlled in response to the first PDAF control signal that is independent of the first or second transfer control signals.

42. The imaging system of claim 41, wherein the first PDAF control signal is further coupled to control a first floating diffusion capacitor of a first neighboring non-active row of the photodiode array, and
  wherein the second PDAF control signal is further coupled to control a second floating diffusion capacitor of a second neighboring non-active row of the photodiode array.

43. The imaging system of claim 41, wherein the first transfer transistor, and the third transfer transistor are coupled to a first floating diffusion, and
  wherein the second transfer transistor, and the fourth transfer transistor are coupled to a second floating diffusion.

44. The imaging system of claim 35, wherein the second transfer transistor is coupled to be controlled in response to a second PDAF control signal that is independent of the first PDAF control signal and independent of the first or second transfer control signals.

45. The imaging system of claim 44, wherein the a third PDAF photodiode of the first 2×2 grouping of PDAF photodiodes is coupled to a third transfer transistor, wherein the first PDAF photodiode and the third PDAF photodiode are in a first column,
  wherein a fourth PDAF photodiode of the first 2×2 grouping of PDAF photodiodes coupled to a fourth transfer transistor, wherein the second PDAF photodiode and the fourth PDAF photodiode are in a second column, wherein the first column and second column are neighboring columns,
  wherein the third transfer transistor is coupled to be controlled in response to the first PDAF control signal, and
  wherein the fourth transfer transistor is coupled to be controlled in response to the second PDAF control signal.

46. The imaging system of claim 45, wherein the first PDAF control signal is further coupled to control a first floating diffusion capacitor of a first neighboring non-active row of the photodiode array, and wherein the second PDAF control signal is further coupled to control a second floating diffusion capacitor of a second neighboring non-active row of the photodiode array.

47. The imaging system of claim 25, wherein exposure times of the second set of photodiodes are different than exposure times of the first set of photodiodes.

48. The imaging system of claim 25, wherein readouts of the second set of photodiodes are configured to be performed separately from readouts of the first set of photodiodes.

49. The imaging system of claim 48, wherein readouts of the second set of photodiodes are configured to be performed after readouts of the first set of photodiodes in the active row of the photodiode array.

50. The imaging system of claim 48, wherein readouts of the second set of photodiodes are configured to be interleaved with readouts of the first set of photodiodes in the active row of the photodiode array.

51. The imaging system of claim 25, further comprising a color filter array disposed over the photodiode array, wherein the color filter array includes a plurality of color filters arranged in a Bayer pattern over the plurality of photodiodes.

52. The imaging system of claim 51, wherein the plurality of photodiodes are arranged in 2×2 binned groupings, wherein each photodiode of each 2×2 binned grouping included in the first set of photodiodes is configured to be illuminated with incident light through respective color filters of the plurality of color filters having a same color.

\* \* \* \* \*

UNITED STATES PATENT AND TRADEMARK OFFICE
CERTIFICATE OF CORRECTION

PATENT NO. : 11,356,626 B2
APPLICATION NO. : 16/855850
DATED : June 7, 2022
INVENTOR(S) : Rui Wang et al.

It is certified that error appears in the above-identified patent and that said Letters Patent is hereby corrected as shown below:

In the Claims

In Column 22, Line 18, before "a" delete "the".
In Column 22, Line 24, before "coupled" insert -- is --.
In Column 22, Line 42, before "a" delete "the".
In Column 22, Line 48, before "coupled" insert -- is --.
In Column 23, Line 19, before "a" delete "the".
In Column 23, Line 25, before "coupled" insert -- is --.
In Column 24, Line 66, delete "photodiode" and insert -- pixel --.
In Column 25, Line 6, delete "photodiode" and insert -- pixel --.
In Column 25, Line 14, delete "photodiode" and insert -- pixel --.
In Column 25, Line 26, delete "photodiode" and insert -- pixel --.
In Column 25, Line 28, delete "photodiode" and insert -- pixel --.
In Column 25, Line 31, delete "photodiode" and insert -- pixel --.
In Column 25, Line 41, delete "photodiode" and insert -- pixel --.
In Column 25, Line 48, before "a" delete "the".
In Column 25, Line 54, before "coupled" insert -- is --.
In Column 25, Line 67, delete "photodiode" and insert -- pixel --.
In Column 26, Line 3, delete "photodiode" and insert -- pixel --.
In Column 26, Line 15, before "a" delete "the".
In Column 26, Line 21, before "coupled" insert -- is --.
In Column 26, Line 33, delete "photodiode" and insert -- pixel --.
In Column 26, Line 37, delete "photodiode" and insert -- pixel --.
In Column 26, Line 49, before "a" delete "the".
In Column 26, Line 55, before "coupled" insert -- is --.
In Column 27, Line 2, delete "photodiode" and insert -- pixel --.
In Column 27, Line 5, delete "photodiode" and insert -- pixel --.
In Column 27, Line 17, delete "photodiode" and insert -- pixel --.
In Column 27, Line 21, delete "photodiode" and insert -- pixel --.
In Column 27, Line 23, delete "photodiode" and insert -- pixel --.

Signed and Sealed this
Thirtieth Day of August, 2022

Katherine Kelly Vidal
*Director of the United States Patent and Trademark Office*